(12) United States Patent
Kamimura

(10) Patent No.: US 12,480,072 B2
(45) Date of Patent: Nov. 25, 2025

(54) CLEANING FLUID AND CLEANING METHOD

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 532 days.

(21) Appl. No.: 18/046,701

(22) Filed: Oct. 14, 2022

(65) Prior Publication Data

US 2023/0065213 A1 Mar. 2, 2023

Related U.S. Application Data

(63) Continuation of application No. PCT/JP2021/009977, filed on Mar. 12, 2021.

(30) Foreign Application Priority Data

| Apr. 16, 2020 | (JP) | 2020-073261 |
| Jul. 9, 2020 | (JP) | 2020-118387 |

(51) Int. Cl.

| C11D 3/34 | (2006.01) |
|---|---|
| B24B 37/34 | (2012.01) |
| C11D 1/00 | (2006.01) |
| C11D 1/65 | (2006.01) |
| C11D 3/00 | (2006.01) |
| C11D 3/04 | (2006.01) |
| C11D 3/20 | (2006.01) |
| C11D 3/22 | (2006.01) |
| C11D 3/28 | (2006.01) |
| C11D 3/30 | (2006.01) |
| C11D 3/33 | (2006.01) |
| C11D 3/36 | (2006.01) |
| C11D 3/37 | (2006.01) |
| H01L 21/02 | (2006.01) |
| C11D 1/34 | (2006.01) |
| C11D 1/62 | (2006.01) |

(52) U.S. Cl.
CPC ................ *C11D 1/65* (2013.01); *B24B 37/34* (2013.01); *C11D 1/00* (2013.01); *C11D 3/0073* (2013.01); *C11D 3/042* (2013.01); *C11D 3/044* (2013.01); *C11D 3/2075* (2013.01); *C11D 3/2082* (2013.01); *C11D 3/2086* (2013.01); *C11D 3/222* (2013.01); *C11D 3/28* (2013.01); *C11D 3/30* (2013.01); *C11D 3/33* (2013.01); *C11D 3/361* (2013.01); *C11D 3/3765* (2013.01); *H01L 21/02074* (2013.01); *C11D 1/342* (2013.01); *C11D 1/345* (2013.01); *C11D 1/62* (2013.01); *C11D 2111/22* (2024.01)

(58) Field of Classification Search
CPC ........... C11D 1/00; C11D 3/042; C11D 3/044; C11D 3/2075; C11D 3/30; C11D 3/28; C11D 3/0073

USPC ........ 510/175, 176, 245, 254, 477, 488, 504
See application file for complete search history.

(56) References Cited

U.S. PATENT DOCUMENTS

| 2009/0078908 | A1 | 3/2009 | Saie et al. | |
|---|---|---|---|---|
| 2009/0261291 | A1* | 10/2009 | Banerjee | C11D 3/3947 252/79.1 |
| 2010/0056409 | A1 | 3/2010 | Walker et al. | |
| 2013/0109181 | A1 | 5/2013 | Guo et al. | |
| 2014/0100151 | A1* | 4/2014 | Egbe | C11D 7/06 510/176 |
| 2015/0140820 | A1 | 5/2015 | Kawada et al. | |
| 2015/0259632 | A1 | 9/2015 | Nakanishi et al. | |
| 2020/0360861 | A1 | 11/2020 | Omatsu et al. | |
| 2022/0073820 | A1 | 3/2022 | Kikkawa et al. | |
| 2022/0372329 | A1* | 11/2022 | Kitamura | H01L 21/30625 |

FOREIGN PATENT DOCUMENTS

| JP | 2008-528762 A | 7/2008 |
|---|---|---|
| JP | 2009-081200 A | 4/2009 |
| JP | 2010-251680 A | 11/2010 |
| JP | 2011-159658 A | 8/2011 |
| JP | 2013-118361 A | 6/2013 |
| JP | 2019-110984 A | 7/2019 |
| JP | 2019-112143 A | 7/2019 |
| JP | 2020-203980 A | 12/2020 |
| TW | 201940224 A | 10/2019 |
| WO | 2013/162020 A1 | 10/2013 |
| WO | 2020/166677 A1 | 8/2020 |

(Continued)

OTHER PUBLICATIONS

International Search Report dated May 25, 2021, issued in International Application No. PCT/JP2021/009977.
Written Opinion dated May 25, 2021, issued in International Application No. PCT/JP2021/009977.
International Preliminary Report on Patentability dated Oct. 13, 2022, issued in International Application No. PCT/JP2021/009977.
Office Action issued Aug. 2, 2024 in Taiwanese Application No. 110112795.
Japanese Office Action dated Dec. 19, 2023 in Japanese Application No. 2022-515251.

*Primary Examiner* — Gregory R Delcotto
(74) *Attorney, Agent, or Firm* — Sughrue Mion, PLLC

(57) ABSTRACT

An object of the present invention is to provide a cleaning liquid for a semiconductor substrate, which has excellent corrosion prevention performance for a metal-containing layer. In addition, another object of the present invention is to provide a method for cleaning a semiconductor substrate. The cleaning liquid of an embodiment of the present invention is a cleaning liquid for a semiconductor substrate that has been subjected to a chemical mechanical polishing treatment, in which the cleaning liquid includes a component A having two or more onium structures in a molecule, and water, and has a pH of 7.0 to 11.8 at 25° C.

20 Claims, No Drawings

(56) References Cited

FOREIGN PATENT DOCUMENTS

| WO | 2020166677 | * | 8/2020 | ............... | C11D 3/30 |
| WO | WO-2020255862 A1 | * | 12/2020 | ............. | B24B 55/06 |

* cited by examiner

CLEANING FLUID AND CLEANING METHOD

CROSS-REFERENCE TO RELATED APPLICATIONS

This application is a Continuation of PCT International Application No. PCT/JP2021/009977 filed on Mar. 12, 2021, which claims priority under 35 U.S.C. § 119(a) to Japanese Patent Application No. 2020-073261 filed on Apr. 16, 2020 and Japanese Patent Application No. 2020-118387 filed on Jul. 9, 2020. Each of the above applications is hereby expressly incorporated by reference, in its entirety, into the present application.

BACKGROUND OF THE INVENTION

1. Field of the Invention

The present invention relates to a cleaning liquid for a semiconductor substrate and a method for cleaning a semiconductor substrate.

2. Description of the Related Art

Semiconductor elements such as charge-coupled devices (CCD) and memories are manufactured by forming fine electronic circuit patterns on a substrate, using photolithography technology. More specifically, the semiconductor elements are manufactured by forming a resist film on a laminate that has a metal film serving as a wiring line material, an etching stop layer, and an interlayer insulating layer on a substrate, and carrying out a photolithography step and a dry etching step (for example, a plasma etching treatment).

In the manufacture of these semiconductor elements, a chemical mechanical polishing (CMP) treatment in which a surface of a substrate having a metal wire film, a barrier film, an insulating film, or the like is flattened using a polishing slurry including polishing fine particles (for example, silica and alumina) may be performed.

In addition, dry etching residues (for example, metal components such as a titanium-based metal derived from a metal hard mask or an organic component derived from a photoresist film) may remain on a substrate which has been subjected to the manufacturing step. In particular, in a substrate which has been subjected to a CMP treatment, polishing fine particles to be used in the CMP treatment, a polished wiring line metal film, and/or a metal component derived from a barrier film and the like easily remain on a surface of a semiconductor substrate after polishing.

Since these residues can short-circuit wiring lines and affect the electrical characteristics of a semiconductor, a step of removing these residues from a surface of the semiconductor substrate is often performed.

For example, JP2008-528762A describes a composition for treating an ultra-small electronic device structure, in which the composition includes (i) an alkanolamine, (ii) a quaternary ammonium hydroxide, and (iii) a specific complexing agent.

SUMMARY OF THE INVENTION

The present inventors have examined a cleaning liquid for a semiconductor substrate with reference to JP2008-528762A and the like, and have thus found that there is room for further improvement in corrosion prevention performance for a metal-containing layer serving as a wiring line material, a plug material, an insulating layer, or the like with regard to the cleaning liquid.

Therefore, an object of the present invention is to provide a cleaning liquid for a semiconductor substrate, in which the cleaning liquid has excellent corrosion prevention performance for a metal-containing layer.

In addition, another object of the present invention is to provide a method for cleaning a semiconductor substrate.

The present inventors have found that the objects can be accomplished by the following configurations.

[1] A cleaning liquid for a semiconductor substrate that has been subjected to a chemical mechanical polishing treatment, the cleaning liquid comprising:
a component A having two or more onium structures in a molecule; and
water,
in which the cleaning liquid has a pH of 7.0 to 11.8 at 25° C.

[2] The cleaning liquid as described in [1],
in which the onium structure is a structure selected from the group consisting of an ammonium structure, a phosphonium structure, and a sulfonium structure.

[3] The cleaning liquid as described in [1] or [2],
in which the onium structure is a structure selected from the group consisting of an ammonium structure and a phosphonium structure.

[4] The cleaning liquid as described in any one of [1] to [3],
in which the onium structure is an ammonium structure.

[5] The cleaning liquid as described in any one of [1] to [3],
in which the component A is a compound represented by General Formula (I) or (II) which will be described later.

[6] The cleaning liquid as described in [5],
in which in General Formulae (I) and (II), n represents 2 and $X^{(2/n)-}$ represents a hydroxide ion.

[7] The cleaning liquid as described in [5] or [6],
in which the component A is the compound represented by General Formula (I).

[8] The cleaning liquid as described in any one of [1] to [7],
in which a content of the component A is 2% to 60% by mass with respect to a total mass of the components excluding a solvent in the cleaning liquid.

[9] The cleaning liquid as described in any one of [1] to [8], further comprising an organic acid or an organic alkali.

[10] The cleaning liquid as described in any one of [1] to [9], further comprising an anticorrosive agent.

[11] The cleaning liquid as described in [10],
in which the anticorrosive agent includes a heteroaromatic compound.

[12] The cleaning liquid as described in [11],
in which the heteroaromatic compound is at least one selected from the group consisting of a tetrazole compound, a triazole compound, an imidazole compound, and a pyrazole compound.

[13] The cleaning liquid as described in any one of [1] to [12], further comprising a surfactant.

[14] The cleaning liquid as described in any one of [1] to [13],
in which the semiconductor substrate has a metal-containing substance including at least one selected from the group consisting of copper, tungsten, and cobalt.

[15] A method for cleaning a semiconductor substrate, comprising a cleaning step of cleaning a semiconductor substrate that has been subjected to a chemical mechanical polishing treatment using the cleaning liquid as described in any one of [1] to [14].

According to the present invention, it is possible to provide a cleaning liquid for a semiconductor substrate, which has excellent corrosion prevention performance for a metal-containing layer.

In addition, according to the present invention, it is possible to provide a method for cleaning a semiconductor substrate.

DESCRIPTION OF THE PREFERRED EMBODIMENTS

Hereinafter, an example of a form for carrying out the present invention will be described.

Descriptions on the configuration requirements which will be described later are made based on representative embodiments of the present invention in some cases, but it should not be construed that the present invention is limited to such embodiments.

In the present specification, a numerical value range expressed using "to" means a range that includes the preceding and succeeding numerical values of "to" as the lower limit value and the upper limit value, respectively.

In the present specification, a reference to "preparation" is meant to encompass delivering a predetermined material by purchases or the like, in addition to comprising specific materials by synthesis, combination, or the like.

In the present specification, in a case where two or more kinds of a certain component are present, the "content" of the component means a total content of the two or more kinds of the components.

The compounds described in the present specification may include isomers (compounds having the same number of atoms but having different structures), optical isomers, and isotopes unless otherwise limited. Moreover, only one kind or a plurality of kinds of the isomers and the isotopes may be included.

In addition, in the notation of a group (atomic group) in the present invention, in a case where the group is noted without specifying whether it is substituted or unsubstituted, the group includes both a group having no substituent and a group having a substituent within a range not interfering with the effect of the present invention. For example, a "hydrocarbon group" includes not only a hydrocarbon group having no substituent (an unsubstituted hydrocarbon group) but also a hydrocarbon group having a substituent (a substituted hydrocarbon group). This also applies to each of compounds.

In the present specification, "ppm" means "parts-per-million ($10^{-6}$)" and "ppb" means "parts-per-billion ($10^{-9}$)".

In the present specification, 1 Å (angstrom) corresponds to 0.1 nm.

In the present specification, psi means a pound-force per square inch; 1 psi=6894.76 Pa.

In the present specification, aspects such as the composition or the physical properties of a cleaning liquid which will be described below are intended to be aspects of a cleaning liquid in a case of being applied to a semiconductor substrate which is an object to be cleaned unless otherwise specified.

[Cleaning Liquid]

The cleaning liquid of an embodiment of the present invention (hereinafter also simply referred to as a "cleaning liquid") is a cleaning liquid for a semiconductor substrate that has been subjected to a CMP treatment, the cleaning liquid including a component A having two or more onium structures, and water. In addition, the pH of the cleaning liquid at 25° C. is 6.0 to 13.5.

The present inventors have found that in a case where the cleaning liquid includes a component A having two or more onium structures, and has a pH1 of 6.0 to 13.5, the corrosion prevention performance for a metal-containing layer of a semiconductor substrate (hereinafter also described as "the effect of the present invention") is improved, thereby completing the present invention.

Although detailed mechanism by which the effect of the present invention is obtained with such a cleaning liquid is unclear, the present inventors have presumed that the component A acts on the metal-containing layer whose surface is charged on the anion side in contact with the cleaning liquid, and thus, the surface of the metal-containing layer is provided with corrosion prevention properties.

Hereinafter, each component included in the cleaning liquid will be described.

[Component A]

The cleaning liquid includes a component A having two or more onium structures in the molecule.

Here, the onium structure included in the component A means a cationic structure in which a proton ($H^+$) is added to a monatomic hydride. Examples of the onium structure include an ammonium structure in which the central atom is N, a phosphonium structure in which the central atom is P, an arsonium structure in which the central atom is As, an oxonium structure in which the central atom is O, and a sulfonium structure in which the central atom is S.

The component A is not particularly limited as long as it is a compound having two or more onium structures in the molecule. The component A may be a salt consisting of a cation having two or more onium structures, and a counterion. In that case, the component A may be ionized in the cleaning liquid.

As the onium structure contained in the component A, an ammonium structure, a phosphonium structure, or a sulfonium structure is preferable, the ammonium structure or the phosphonium structure is more preferable, and the ammonium structure is still more preferable.

The number of onium structures contained in the molecule of the component A is preferably 2 to 6, more preferably 2 to 4, still more preferably 2 or 3, and particularly preferably 2.

The component A preferably has a monovalent organic group bonded to the central atom of the onium structure and a linking group bonded to the central atoms of two or more onium structures.

Examples of the monovalent organic group include an aliphatic hydrocarbon group, an aromatic hydrocarbon group, and a group formed by combination of two or more of these groups. As the monovalent organic group, an alkyl group, an alkenyl group, a cycloalkyl group, an aryl group, or an aralkyl group is preferable.

The monovalent organic group preferably has 1 to 20 carbon atoms, more preferably has 1 to 14 carbon atoms, and still more preferably has 1 to 10 carbon atoms.

In a case where the component A has two or more of the organic groups, those organic groups may be the same as or different from each other.

Examples of the alkyl group include a methyl group, an ethyl group, a propyl group, a butyl group, a pentyl group, a hexyl group, a heptyl group, and an octyl group; and the methyl group, the ethyl group, the propyl group, or the butyl group is preferable, and the methyl group is more preferable.

As the alkenyl group, an alkenyl group having 2 to 10 carbon atoms is preferable, and an ethynyl group or a propyl group is more preferable.

As the cycloalkyl group, a cycloalkyl group having 3 to 10 carbon atoms is preferable, a cyclohexyl group or a cyclopentyl group is more preferable, and a cyclohexyl group is still more preferable.

As the aryl group, an aryl group having 6 to 14 carbon atoms is preferable, a phenyl group or a naphthyl group is more preferable, and the phenyl group is still more preferable.

As the aralkyl group, an aralkyl group having 7 to 14 carbon atoms is preferable, and a benzyl group is more preferable.

The monovalent organic group may further have a substituent. Examples of the substituent that can be introduced include a hydroxyl group, an amino group, a carboxyl group, a phosphoric acid group, an imino group, a thiol group, a sulfo group, and a nitro group.

As the linking group bonded to the central atoms of the two or more onium structures, a divalent linking group bonded to the central atoms of the two onium structures is preferable.

Examples of the divalent linking group include an aliphatic hydrocarbon group, an aromatic hydrocarbon group, and a group formed by combination of two or more of these groups. As the divalent linking group, an alkylene group, an alkenylene group, a cycloalkylene group, an arylene group, or a group formed by combination of two or more of these groups is preferable.

The divalent linking group may have —S—, —S(=O)$_2$—, —O—, —C(=O)—, and a group formed by a combination of two or more of these groups, instead of the methylene group (—CH$_2$—) constituting the divalent linking group. In addition, the divalent linking group may have a linking group in which the central atom (preferably a nitrogen atom) of the onium structure has two of the monovalent substituents, instead of the methylene group (—CH$_2$—) constituting the linking group.

The divalent linking group preferably has 1 to 30 carbon atoms, more preferably 2 to 20 carbon atoms, and still more preferably 2 to 12 carbon atoms.

As the alkylene group, an alkylene group having 1 to 10 carbon atoms is preferable. Among those, a methylene group, an ethylene group, a propylene group, a butylene group, a pentylene group, a hexylene group, a heptylene group, or an octylene group is more preferable, and the ethylene group or the pentylene group is still more preferable.

As the alkenylene group, an alkenylene group having 2 to 10 carbon atoms is preferable, an ethynylene group or a propynylene group is more preferable, and the propynylene group is still more preferable.

As the cycloalkylene group, a cycloalkylene group having 3 to 10 carbon atoms is preferable, a cyclohexylene group or a cyclopentylene group is more preferable, and the cyclohexylene group is still more preferable.

As the arylene group, an alkylene group having 6 to 14 carbon atoms is preferable, a phenylene group or a naphthylene group is more preferable, and the phenylene group is still more preferable.

As the group formed by combination of two or more selected from the alkylene group, the alkenylene group, the cycloalkylene group, and the arylene group, a dialkylphenyl group or a biphenyl group is preferable.

The linking group may further have a substituent. Examples of the substituent that can be introduced include a hydroxyl group, an amino group, a carboxyl group, a phosphoric acid group, an imino group, a thiol group, a sulfo group, and a nitro group.

In addition, in the component A, two or more linking groups bonded to one onium structure may be present. For example, in a case where the component A has two onium structures, the component A may have two or more divalent linking groups that link the two onium structures. In a case where the component A has two or more linking groups, the linking groups may be the same as or different from each other.

Examples of the counterion contained in the component A include a monovalent anion and a divalent anion.

More specific examples of the counterion include a nitrate ion, a sulfate ion, a halide ion (for example, a bromide ion, a chloride ion, a fluoride ion, and an iodide ion), a citrate ion, a phosphate ion, an oxalate ion, a phthalate ion, a maleate ion, a gluconate ion, a fumarate ion, a tartrate ion, a malate ion, a glycolate ion, a hydroxide ion, an acetate ion, a trifluoroacetate ion, a borate ion, a lactate ion, a thiocyanate ion, a cyanate ion, a sulfate ion, a silicate ion, a perhalide ion (for example, a perbromate ion, a perchlorate ion, and a periodate ion), a chromate ion, a p-toluenesulfonic acid ion, a benzenesulfonic acid ion, a methanesulfonate ion, a trifluoromethanesulfonate ion, an ethanesulfonic acid ion, a diglycolate ion, a 2,5-furandicarboxylate ion, a 2-tetrafluoroborate ion, a tetrafluoroborate ion, and a hexafluorophosphate ion.

Among those, the nitrate ion, the citrate ion, the phosphate ion, the oxalate ion, the phthalate ion, the maleate ion, the fumarate ion, the tartrate ion, the malate ion, the glycolate ion, the hydroxide ion, the acetate ion, the trifluoroacetate ion, the lactate ion, the sulfate ion, the silicate ion, the p-toluenesulfonate ion, the benzenesulfonate ion, the methanesulfonate ion, the trifluoromethane sulfonate ion, the ethanesulfonate ion, the diglycolate ion, the 2,5-furandicarboxylate ion, the 2-tetracarboxylic acid ion, the borate ion, the tetrafluoroborate ion, or the hexafluorophosphate ion is preferable, the hydroxide ion, the sulfate ion, or the phosphate ion is more preferable, and the hydroxide ion is still more preferable.

The component A is preferably a compound represented by General Formula (I) or (II), and more preferably the compound represented by General Formula (I).

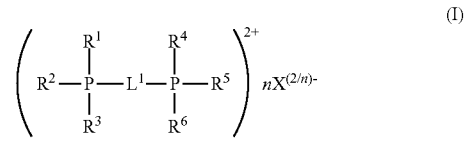

In General Formula (I), $R^1$ to $R^6$ each independently represent a monovalent organic group. Two of $R^1$ to $R^6$ may be bonded to each other. $L^1$ represents a divalent linking group. $X^{(2/n)-}$ represents a (2/n)-valent counterion. n represents 1 or 2.

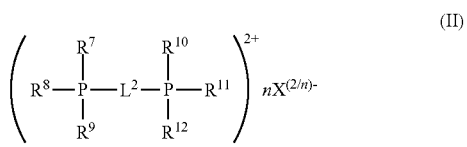

In General Formula (11), $R^7$ to $R^{12}$ each independently represent a monovalent organic group. Two of $R^7$ to $R^{12}$ may be bonded to each other. IL represents a divalent linking group. $X^{(2/n)-}$ represents a (2/n)-valent counterion. n represents 1 or 2.

Furthermore, preferred aspects of the monovalent organic groups represented by $R^1$ to $R^6$ and $R^7$ to $R^{12}$ in General Formulae (I) and (II) are the same as described earlier as the preferred aspects of the monovalent organic group bonded to the central atom of the onium structure having the component A.

In addition, preferred aspects of the divalent linking groups represented by $L^1$ and $L^2$, the linking group formed by the mutual bonding of two of $R^1$ to $R^6$, and the linking group formed by the mutual bonding of two of $R^7$ to $R^{12}$ in General Formulae (I) and (II) are the same as described earlier as the preferred aspects of the divalent linking group bonded to the central atom of the two onium structures having the component A.

$X^{(2/n)-}$ in General Formulae (I) and (II) represents a monovalent or divalent counterion. That is, in a case where n is 1, $X^{(2/n)-}$ represents a divalent counterion, and in a case where n is 2, $X^{(2/n)-}$ represents a monovalent counterion.

Preferred aspects of the monovalent or divalent counterion represented by $X^{(2/n)-}$ in General Formulae (I) and (II) are the same as described earlier as the preferred aspects of the counterion contained in the component A.

Hereinafter, cations (A-1) to (A-32) am shown as specific examples of cations having two onium structures constituting the component A.

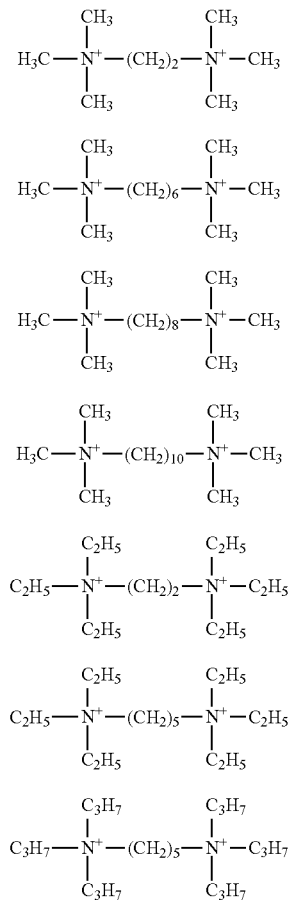

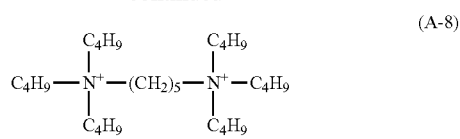

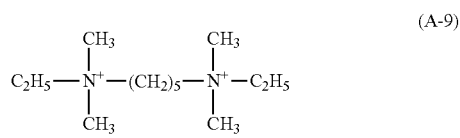

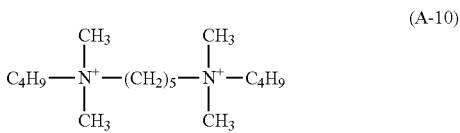

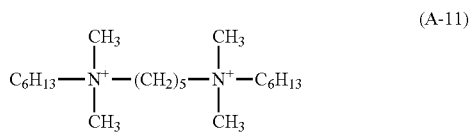

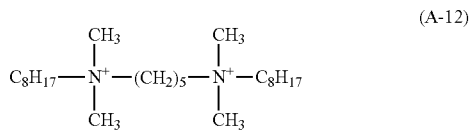

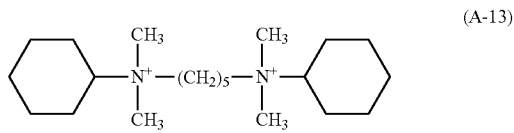

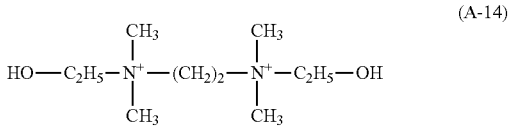

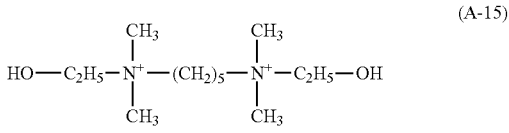

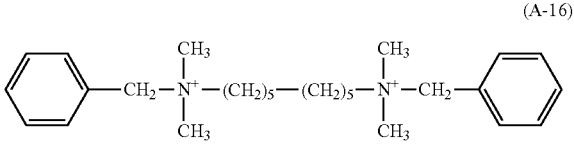

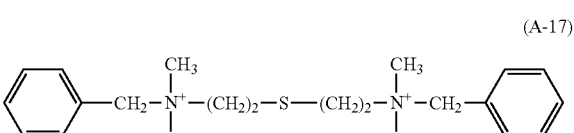

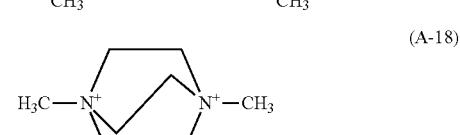

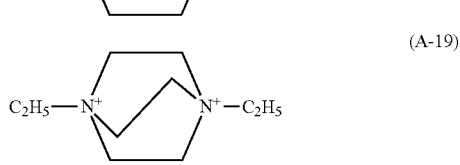

-continued (A-20)
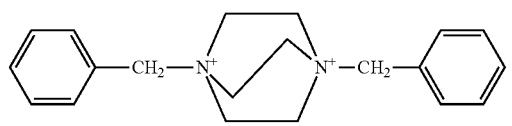

(A-21)
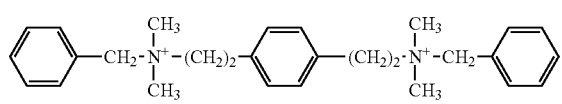

(A-22)
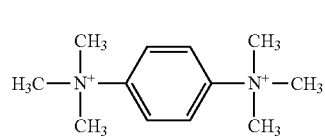

(A-23)
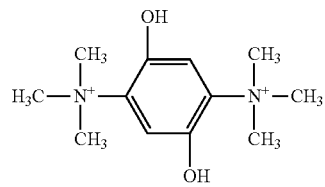

(A-24)
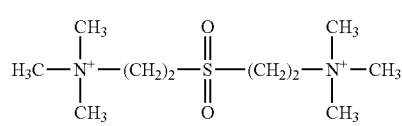

(A-25)
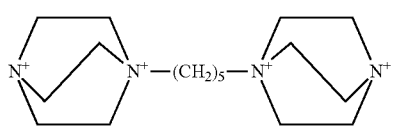

(A-26)
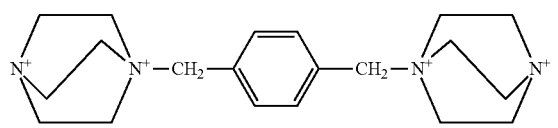

(A-27)
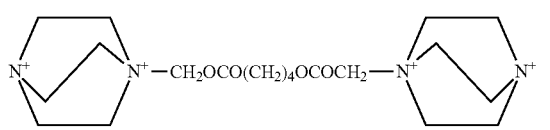

(A-28)
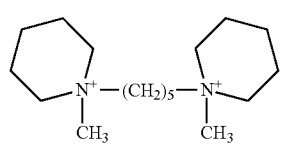

(A-29)
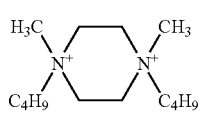

(A-30)
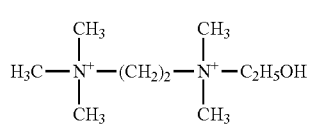

(A-31)
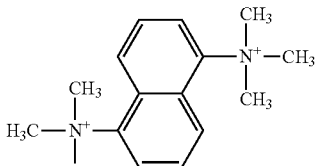

(A-32)
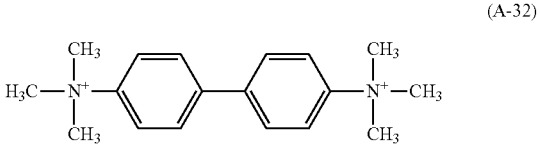

In addition, specific examples of a cation having two onium structures constituting the component A also include cations (A-X1) to (A-X32) corresponding to cations in which "$N^+$" in the cations (A-1) to (A-32) is substituted with "$P^+$". For example, the cations (A-X1) and (A-X2) are each represented by the following chemical formulae.

(A-X1)
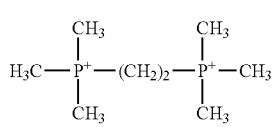

(A-X2)
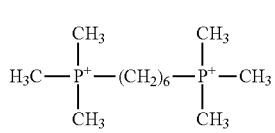

The component A preferably has a cation selected from the group consisting of the cations (A-1) to (A-32) and (A-X1) to (A-X32), and more preferably has a cation selected from the group consisting of the cations (A-1) to (A-15), (A-18), (A-19), (A-22), (A-23), (A-29) to (A-32), (A-X1) to (A-X15), (A-X18), (A-X19), (A-X22), (A-X23), and (A-X29) to (A-X32).

Among those, as the component A, the compounds having the cations (A-1) to (A-15) and (A-X1) to (A-X15) are still more preferable, and the compounds having the cations (A-1) to (A-10), and (A-X1) to (A-X10) are particularly preferable.

As the component A, a commercially available compound may be used, or a compound synthesized according to a known method may be used. Examples of the method for synthesizing the component A include a method for synthesizing the component A by a substitution reaction in which ammonia or various amines act as a nucleophile.

The component A is preferably used in a cleaning liquid in the form of a salt consisting of a cation having two or more onium structures, and a counterion.

The component A preferably has a low molecular weight. More specifically, the molecular weight of the component A is preferably 700 or less, more preferably 500 or less, and still more preferably 400 or less. The lower limit value is not particularly limited, but is preferably 120 or more.

In addition, the component A preferably has 50 or less carbon atoms, more preferably has 40 or less carbon atoms, and still more preferably has 30 or less carbon atoms. The lower limit value is not particularly limited, but is preferably 6 or more.

The component A may be used alone or in combination of two or more kinds thereof.

From the viewpoint that the effect of the present invention is more excellent, the content of the component A is preferably 0.000001% by mass or more, more preferably 0.0001% by mass or more, still more preferably 0.005% by mass or more, and particularly preferably 0.008% by mass or more with respect to the total mass of the cleaning liquid.

The upper limit value of the content of the component A is not particularly limited, but is preferably 0.2% by mass or less, more preferably 0.1% by mass or less, still more preferably 0.08% by mass or less, and particularly preferably 0.05% by mass or less with respect to the total mass of the cleaning liquid from the viewpoint that the particle removal performance is more excellent.

In addition, the content of the component A is preferably 0.02% to 80% by mass, more preferably 0.3% to 70% by mass, and still more preferably 2% to 60% by mass, and particularly preferably 15% to 60% by mass with respect to the total mass of the components excluding a solvent in the cleaning liquid.

Furthermore, "the total mass of the components excluding the solvent in the cleaning liquid" means the total content of all the components included in the cleaning liquid other than water and the organic solvent. Hereinafter, "the total mass of components excluding solvent" in the cleaning liquid is also referred to as "the total solid content".

[Water]

The cleaning liquid preferably includes water as a solvent.

The type of water used for the cleaning liquid is not particularly limited as long as it does not adversely affect a semiconductor substrate, and distilled water, deionized water, and pure water (ultrapure water) can be used. Pure water is preferable from the viewpoint that it includes almost no impurities and has less influence on a semiconductor substrate in a step of manufacturing the semiconductor substrate.

The content of water in the cleaning liquid may be a balance other than the component A and optional components which will be described later. The content of water, is, for example, preferably 99% by mass or more, more preferably 99.3% by mass or more, still more preferably 99.0% by mass or more, and particularly preferably 99.85% by mass or more with respect to the total mass of the cleaning liquid. The upper limit value is not particularly limited, but is preferably 99.99% by mass or less, and more preferably 99.95% by mass or less with respect to the total mass of the cleaning liquid.

[Optional Components]

The cleaning liquid may include other optional components, in addition to the above-mentioned components. Examples of the optional components include an organic acid, an organic alkali, an anticorrosive agent, a surfactant, a chelating agent whose coordinating group is a nitrogen-containing group (hereinafter also referred to as a "specific chelating agent"), an oxidizing agent, and various additives.

The cleaning liquid preferably includes at least one selected from the group consisting of an organic acid, an organic alkali, an anticorrosive agent, a surfactant, a specific chelating agent, an oxidizing agent, and an organic solvent, and more preferably includes the organic acid or the organic alkali.

Hereinafter, the optional components will be described.

<Organic Acid>

The cleaning liquid preferably includes an organic acid from the viewpoint that the removal performance of the metal-containing substance is improved.

An organic acid is an organic compound that has an acidic functional group and is acidic (with a pH of less than 7.0) in an aqueous solution. Examples of the acidic functional group include a carboxyl group, a phosphonic acid group, a sulfo group, a phenolic hydroxyl group, and a mercapto group.

Furthermore, in the present specification, the compound functioning as an anionic surfactant, which will be described later, and the compound included in the anionic polymer compound are not included in the organic acid.

The organic acid is not particularly limited, but examples thereof include a carboxylic acid having a carboxyl group in the molecule (organic carboxylic acid), a phosphonic acid having a phosphonic acid group in the molecule (organic phosphonic acid), and a sulfonic acid having a sulfo group in the molecule (organic sulfonic acid), and the carboxylic acid or the phosphonic acid is preferable.

The number of functional groups contained in the organic acid is not particularly limited, but is preferably 1 to 4, and more preferably t to 3.

In addition, the organic acid is preferably a compound having a function of chelating with a metal included in the residue from the viewpoint that the cleaning performance is excellent, and the organic acid is more preferably a compound having two or more functional groups (coordinating groups) that coordinate with a metal ion in the molecule. Examples of the coordinating group include the acidic functional groups, and the carboxylic acid group or the phosphonic acid group is preferable.

(Carboxylic Acid)

The carboxylic acid may be a monocarboxylic acid having one carboxyl group or a polycarboxylic acid having 2 or more carboxyl groups. The polycarboxylic acid having 2 or more (more preferably 2 to 4, and still more preferably 2 or 3) carboxyl groups is preferable from the viewpoint that the cleaning performance is more excellent.

Examples of the carboxylic acid include an aminopolycarboxylic acid, an amino acid, a hydroxycarboxylic acid, and an aliphatic carboxylic acid.

—Aminopolycarboxylic Acid—

The aminopolycarboxylic acid is a compound having one or more amino groups and two or more carboxy groups as the coordinating group in the molecule.

Examples of the aminopolycarboxylic acid include aspartic acid, glutamate, butylenediaminctetraacetic acid, diethylenetriaminepentaacetic acid (DTPA), ethylenediaminetetrapropionic acid, triethylenetetraaminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanctetraacetic acid (CyDTA), ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanctetraacetic acid, 1,4,7,10-tetraazacyclododecane-tetraacetic acid, diaminopropanoltetraacetic acid, (hydroxyethyl)ethylenediaminetriacetic acid, and iminodiacetic acid (IDA).

Among those, DTPA, EDTA, CyDTA, or IDA is preferable.

—Amino Acid—

The amino acid is a compound that has one carboxyl group and one or more amino groups in the molecule.

Examples of the amino acid include glycine, seine, α-alanine (2-aminopropionic acid), β-alanine (3-aminopropionic acid), lysine, leucine, isoleucine, cystine, cysteine, methionine, ethionine, threonine, tryptophan, tyrosine, valine, histidine, a histidine derivative, asparagine, glutamine, arginine, proline, phenylalanine, the compounds described in paragraphs [0021] to [0023] of JP2016-086094A, and salts thereof. Incidentally, as the histidine derivative, the compounds described in JP2015-165561A and JP2015-165562A, the contents of which are incorporated herein by reference, can be used. In addition, examples of the salt include alkali metal salts such as a sodium salt and a potassium salt, an ammonium salt, a carbonate, and acetate.

Among those, histidine, the histidine derivative, or the sulfur-containing amino acid containing a sulfur atom is preferable, and histidine or the sulfur-containing amino acid is more preferable. Examples of the sulfur-containing amino acid include cystine, cysteine, ethionine, and methionine, and cystine or cysteine is preferable.

—Hydroxycarboxylic Acid—

A hydroxycarboxylic acid is a compound having one or more hydroxyl groups and one or more amino groups in the molecule.

Examples of the hydroxycarboxylic acid include malic acid, citric acid, glycolic acid, gluconic acid, heptonic acid, tartaric acid, and lactic acid; and gluconic acid, glycolic acid, malic acid, tartaric acid, or citric acid is preferable, and gluconic acid or citric acid is more preferable.

—Aliphatic Carboxylic Acid—

Examples of the aliphatic carboxylic acid include oxalic acid, malonic acid, succinic acid, glutaric acid, adipic acid, pimelic acid, sebacic acid, and maleic acid, and from the viewpoint that the effect of the present invention and the cleaning performance are improved, the adipic acid is preferable.

Examples of carboxylic acids other than the aminopolycarboxylic acid, the amino acid, the hydroxycarboxylic acid, and the aliphatic carboxylic acid include monocarboxylic acids.

Examples of the monocarboxylic acid include lower (1 to 4 carbon atoms) aliphatic monocarboxylic acids such as formic acid, acetic acid, propionic acid, and butyric acid.

As the carboxylic acid, an amino acid, a hydroxycarboxylic acid, or an aliphatic carboxylic acid is preferable, cystine, cysteine, histidine, gluconic acid, glycolic acid, malic acid, tartaric acid, citric acid, or adipic acid is more preferable, and cysteine, gluconic acid, citric acid, or adipic acid is still more preferable.

The carboxylic acid may be used alone or in combination of two or more kinds thereof.

The content of the carboxylic acid in the cleaning liquid is not particularly limited, but is preferably 0.001% to 0.1% by mass, and more preferably 0.005% to 0.05% by mass with respect to the total mass of the cleaning liquid.

In addition, the content of the carboxylic acid is preferably 1% to 80% by mass, and more preferably 5% to 60% by mass with respect to the total solid content of the cleaning liquid.

(Phosphonic Acid)

The phosphonic acid may be a monophosphonic acid having one phosphonic acid or a polyphosphonic acid having two or more phosphonic acid groups. From the viewpoint that the cleaning performance is more excellent, the polyphosphonic acid having two or more phosphonic acid groups is preferable.

As the polyphosphonic acid, the compounds represented by General Formulae [1] to [3] described in paragraphs [0013] to [0023] of WO2013/162020A, the compounds described in paragraphs [0026] to [0036] of WO2018/020878A, or the compounds ((co)polymers) described in paragraphs [0031] to [0046] of WO2018/030006A, the contents of which can be incorporated herein by reference, can be used.

Examples of the polyphosphonic acid include ethylidene diphosphonic acid, 1-hydroxyethylidene-1,1'-diphosphonic acid (HEDPO), 1-hydroxypropyridene-1,1'-diphosphonic acid, and 1-hydroxybutylidene-1,1'-diphosphonic acid, ethylaminobis(methylenephosphonic acid), dodecylaminobis(methylenephosphonic acid), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylcnediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), diethylenetriaminepenta(methylenephosphonic acid) (DEPPO), diethylenetriaminepenta(ethylenephosphonic acid), triethylenetetraminehcxa(methylenephosphonic acid), and triethylenetetraminehcxa(ethylenephosphonic acid), and HEDPO is preferable.

The number of phosphonic acid groups contained in the phosphonic acid is preferably 2 to 5, more preferably 2 to 4, and still more preferably 2 or 3.

In addition, the phosphonic acid preferably has 12 or less carbon atoms, more preferably has 10 or less carbon atoms, and still more preferably 8 or less carbon atoms. The lower limit value is not particularly limited, and is preferably 1 or more.

The phosphonic acid may be used alone or in combination of two or more kinds thereof.

The content of the phosphonic acid in the cleaning liquid is not particularly limited, but is preferably 0.02% by mass or less, and more preferably 0.01% by mass or less with respect to the total mass of the cleaning liquid. The lower limit value is not particularly limited, but is preferably 0.0001% by mass or more, and more preferably 0.0005% by mass or more with respect to the total mass of the cleaning liquid.

In addition, the content of the phosphonic acid is preferably 1% to 60% by mass, and more preferably 2% to 50% by mass with respect to the total solid content of the cleaning liquid.

The organic acid preferably has a low molecular weight. More specifically, the molecular weight of the organic acid is preferably 600 or less, more preferably 450 or less, and still more preferably 300 or less. The lower limit value is not particularly limited, but is preferably 85 or more.

In addition, the organic acid preferably has 15 or less carbon atoms, more preferably has 12 or less carbon atoms, and still more preferably 8 or less carbon atoms. The lower limit value is not particularly limited, but is preferably 2 or more.

The organic acid may be used alone or in combination of two or more kinds thereof.

The content of the organic acid in the cleaning liquid is not particularly limited, but is preferably 0.1% by mass or less, and more preferably 0.05% by mass or less with respect to the total mass of the cleaning liquid. The lower limit value is not particularly limited, but is preferably 0.0001% by mass or more, and more preferably 0.0003% by mass or more with respect to the total mass of the cleaning liquid.

In addition, the content of the organic acid is preferably 1% to 80% by mass, and more preferably 5% to 60% by mass with respect to the total solid content of the cleaning liquid.

<Organic Alkali>

The cleaning liquid may include an organic alkali.

The organic alkali is an organic compound having an alkaline (basic) functional group and exhibiting alkalinity (with a pH of more than 7.0) in an aqueous solution.

Examples of the organic alkali include an amine compound and a quaternary ammonium compound. Incidentally, in the present specification, the quaternary ammonium compound is intended to be a compound having one quaternary ammonium structure.

(Amine Compound)

The amine compound is a compound having an amino group in the molecule, in which the compound is not included in the heteroaromatic compound which will be described later.

Examples of the amine compound include a primary aliphatic amine having a primary amino group (—NH$_2$) in the molecule, a secondary aliphatic amine having a secondary amino group (>NH) in the molecule, and a tertiary aliphatic amine having a tertiary amino group (>N—) in the molecule.

The amine compound is a compound having a group selected from a primary amino group, a secondary amino group, and a tertiary amino group (which may be hereinafter collectively referred to as "primary to tertiary amino groups") in the molecule, or a salt thereof, and is not particularly limited as long as it is a compound having no heterocyclic ring including a nitrogen atom.

Examples of the salt of the amine compound include a salt of an inorganic acid in which at least one non-metal selected from the group consisting of Cl, S, N, and P is bonded to hydrogen, and the salt is preferably a hydrochloride, a sulfate, or a nitrate.

Examples of the amine compound include an amino alcohol, an alicyclic amine compound, and an aliphatic monoamine compound, and an aliphatic polyamine compound other than the amino alcohol and the alicyclic amine.

—Amino Alcohol—

The amino alcohol is a compound having at least one hydroxylalkyl group in the molecule among the amine compounds, and is also referred to as an alkanolamine. The amino alcohol may have any of primary to tertiary amino groups, but preferably has the primary amino group.

Examples of the amino alcohol include monoethanolamine (MEA), diethanolamine (DEA), triethanolamine (TEA), diethylene glycolamine (DEGA), trishydroxymethylaminomethane (Tis), and 2-amino-2-methyl-1-propanol (AMP), 2-amino-2-methyl-1,3-dipropanol (AMPD), 2-amino-2-ethyl-1,3-dipropanol (AEPD), 2-(methylamino)-2-methyl-1-propanol (N-MAMP), 2-(aminoethoxy)ethanol (AEE), and 2-(2-aminoethylamino)ethanol (AAE).

Among those, AMP, N-MAMP, MEA, DEA, or TEA is preferable, and AMP, MEA, or TEA is more preferable.

The amino alcohol may be used alone or in combination of two or more kinds thereof.

From the viewpoint that the effect of the present invention is more excellent, the content of the amino alcohol is preferably 0.0001% by mass or more, more preferably 0.003% by mass or more, and still more preferably 0.008% by mass or more with respect to the total mass of the cleaning liquid. The upper limit value of the content of the amino alcohol is not particularly limited, but from the viewpoint that the effect of the present invention is more excellent, the upper limit value is preferably 0.2% by mass or less, more preferably 0.08% by mass or less, and still more preferably 0.04% by mass or less with respect to the total mass of the cleaning liquid.

Moreover, in a case where the cleaning liquid includes the amino alcohol, a mass ratio of the content of the component A to the content of amino alcohol (the content of component A/the content of amino alcohol) is preferably 0.01 to 20, and from the viewpoint that the effect of the present invention is more excellent, the mass ratio is more preferably 0.08 to 3, and still more preferably 0.12 to 0.8.

In addition, in a case where the cleaning liquid includes an amino alcohol, the content of the amino alcohol is preferably 1% to 90% by mass, more preferably 10% to 70% by mass, and still more preferably 25% to 60% by mass with respect to the total solid content of the cleaning liquid from the viewpoint that the effect of the present invention is more excellent.

—Alicyclic Amine Compound—

The alicyclic amine compound is not particularly limited as long as it is a compound having a non-aromatic heterocyclic ring in which at least one of the atoms constituting the ring is a nitrogen atom.

Examples of the alicyclic amine compound include a piperazine compound and a cyclic amidine compound.

The piperazine compound is a compound having a hetero-6-membered ring (piperazine ring) in which the opposite —CH— group of a cyclohexane ring is substituted with a nitrogen atom.

The piperazine compound may have a substituent on the piperazine ring. Examples of such a substituent include a hydroxy group, an alkyl group having 1 to 4 carbon atoms, which may have a hydroxy group, and an aryl group having 6 to 10 carbon atoms.

Examples of the piperazine compound include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl)piperazine (HEP), N-(2-aminoethyl)piperazine (AEP), 1,4-bis(2-hydroxyethyl) piperazine (BHEP), 1,4-bis(2-aminoethyl) piperazine (BAEP), and 1,4-bis(3-aminopropyl) piperazine (BAPP).

The cyclic amidine compound is a compound having a heterocyclic ring including an amidine structure (>N—C=N—) in the ring.

The number of ring members of the heterocyclic ring contained in the cyclic amidine compound is not particularly limited, but is preferably 5 or 6, and more preferably 6.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimid[1.2-a]azocine, 3,4,6,7,8,9-hexahydro-2H-pyrido[1.2-a]pyrimidine, 2,5,6,7-tetrahydro-3H-pyrrolo[1.2-a]imidazole, 3-ethyl-2,3,4,6,7,8,9,10-octahydropyrimid[1.2-a]azepine, and creatinine.

Other examples of the alicyclic amine compound include a compound having a non-aromatic, hetero-5-membered ring such as 1,3-dimethyl-2-imidazolidinone and imidazolidinethione, and a compound having a 7-membered ring, including a nitrogen atom.

—Aliphatic Monoamine Compound—

The aliphatic monoamine compound other than the amino alcohol and the alicyclic amine is not particularly limited as long as it is a compound not included in the primary amine, and examples thereof include methylamine, ethylamine, propylamine, dimethylamine, diethylamine, n-butylamine, 3-methoxypropylamine, tert-butylamine, n-hexylamine, cyclohexylamine, n-octylamine, 2-ethylhexylamine, and 4-(2-aminoethyl) morpholine (AEM).

—Aliphatic Polyamine Compound—

Examples of the aliphatic polyamine compound other than amino alcohols and alicyclic amines include alkylenediamines such as ethylenediamine (EDA), 1,3-propanediamine (PDA), 1,2-propanediamine, 1,3-butanediamine, and 1,4-butanediamine, and polyalkylpolyamines such as diethylenetriamine (DETA), triethylenetetramine (TETA), bis(aminopropyl)ethylenediamine (BAPEDA), and tetraethylenepentamine.

In addition, as the amine compound, the compounds described in paragraphs [0034] to [0056] of WO2013/162020A, the contents which are incorporated herein by reference, can be used.

The amine compound preferably has one or more hydrophilic groups in addition to one primary to tertiary amino group. Examples of the hydrophilic group include primary to tertiary amino groups and a hydroxyl group. Examples of the amine compound having one or more hydrophilic groups in addition to one primary to tertiary amino group include an amino alcohol, an aliphatic polyamine compound, and a compound having two or more hydrophilic groups among alicyclic amine compounds, and the amino alcohol is preferable.

The upper limit value of the total number of the hydrophilic groups contained in the amine compound is not particularly limited, but is preferably 4 or less, and more preferably 3 or less.

The number of primary to tertiary amino groups contained in the amine compound is not particularly limited, but is preferably 1 to 4, and more preferably 1 to 3.

In addition, the molecular weight of the amine compound is not particularly limited, but is preferably 200 or less, and more preferably 150 or less. The lower limit value is not particularly limited, but is preferably 60 or more.

In a case where the cleaning liquid includes an amine compound, the content of the amine compound is preferably 0.0001% by mass or more, more preferably 0.003% by mass or more, and still more preferably 0.008% by mass or more with respect to the total mass of the cleaning liquid. The upper limit value of the content of the amine compound is preferably 0.2% by mass or less, more preferably 0.08% by mass or less, and still more preferably 0.04% by mass or less with respect to the total mass of the cleaning liquid.

In a case where the cleaning liquid includes an amine compound, the mass ratio of the content of the component A to the content of the amine compound (the content of component A/the content of the amine compound) is preferably 0.01 to 20, more preferably 0.08 to 3, and still more preferably and 0.12 to 0.8 from the viewpoint that the effect of the present invention is more excellent.

In addition, in a case where the cleaning liquid includes an amine compound, the content of the amine compound is preferably 1% to 90% by mass, more preferably 10% to 75% by mass, and still more preferably 15% to 70% by mass with respect to the total solid content of the cleaning liquid.

(Quaternary Ammonium Compound)

The cleaning liquid may include a quaternary ammonium compound which is a compound having one quaternary ammonium cation or a salt thereof in the molecule.

The quaternary ammonium compound is not particularly limited as long as it is a compound having one quaternary ammonium cation in which a nitrogen atom is substituted with four hydrocarbon groups (preferably an alkyl group), or a salt thereof.

Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate.

As the quaternary ammonium compound, a quaternary ammonium hydroxide represented by Formula (I) is preferable.

$$(R^{13})_4N^+OH^- \quad (1)$$

In the formula, $R^{13}$ represents an alkyl group which may have a hydroxy group or a phenyl group as a substituent. Four of $R^{13}$'s may be the same as or different from each other.

As the alkyl group represented by $R^{13}$, an alkyl group having 1 to 4 carbon atoms is preferable, and a methyl group or an ethyl group is preferable.

As the alkyl group which may have a hydroxy group or a phenyl group, represented by $R^{13}$, a methyl group, an ethyl group, a propyl group, a butyl group, a 2-hydroxyethyl group, or a benzyl group is preferable, the methyl group, the ethyl group, the propyl group, the butyl group, or the 2-hydroxyethyl group is more preferable, and the methyl group, the ethyl group, or the 2-hydroxyethyl group is still more preferable.

Examples of the quaternary ammonium compound include tetramethylammonium hydroxide (TMAH), trimethylethylammonium hydroxide (TMEAH), diethyldimethylammonium hydroxide (DEDMAH), methyltriethylammonium hydroxide (MTEAH), tetraethylammonium hydroxide (TEAH), tetrapropylammonium hydroxide (TPAH), tetrabutylammonium hydroxide (TBAH), 2-hydroxyethyltrimethylammonium hydroxide (choline), bis(2-Hydroxyethyl) dimethylammonium hydroxide, tri(2-hydroxyethyl) methylammonium hydroxide, tetra(2-hydroxyethyl) ammonium hydroxide, benzyltrimethylammonium hydroxide (BTMAH), and cetyltrimethylammonium hydroxide.

As the quaternary ammonium compound other than the specific examples, for example, the compound described in paragraph [0021] of JP2018-107353A, the contents of which are incorporated herein by reference, can be used.

The quaternary ammonium compound may be used alone or in combination of two or more kinds thereof.

The content of the quaternary ammonium compound is preferably 0.00001% to 0.2% by mass, and more preferably 0.0001% to 0.1% by mass with respect to the total mass of the cleaning liquid.

In addition, in a case where the cleaning liquid includes a quaternary ammonium compound, the content of the quaternary ammonium compound is preferably 0.01% to 30% by mass, and more preferably 0.1% to 10% by mass with respect to the total solid content of the cleaning liquid.

The cleaning liquid may include an organic alkali other than the amine compound and the quaternary ammonium compound. Examples of such another organic alkali include a compound selected from the group consisting of amine oxide, nitro, nitroso, oxime, ketoxime, aldoxime, lactam, isocyanide, and urea, which are not included in the component A.

The organic alkali may be used alone or in combination of two or more kinds thereof.

The content of the organic alkali is preferably 0.00001% to 0.2% by mass, and more preferably 0.0001% to 0.1% by mass with respect to the total mass of the cleaning liquid.

In addition, in a case where the cleaning liquid includes an organic alkali, the content of the organic alkali compound is preferably 1% to 90% by mass, more preferably 10% to 75% by mass, and still more preferably 15% to 70% by mass with respect to the total solid content of the cleaning liquid.

<Anticorrosive Agent>

The cleaning liquid preferably includes an anticorrosive agent (corrosion inhibitor) from the viewpoint that the effect of the present invention is more excellent.

The anticorrosive agent used in the cleaning liquid is not particularly limited, and examples thereof include a heteroaromatic compound, an ascorbic acid compound, a catechol compound, a hydrazide compound, a reducing sulfur compound, and an anionic polymer compound.

(Heteroaromatic Compound)

The cleaning liquid may include a heteroaromatic compound as the anticorrosive agent.

The heteroaromatic compound is a compound having a heteroaromatic ring structure in the molecule. The heteroaromatic compound is not particularly limited as long as it is a compound having a heteroaromatic ring, and examples thereof include a nitrogen-containing, heteroaromatic compound having a heteroaromatic ring (nitrogen-containing, heteroaromatic ring) in which at least one of the atoms constituting the ring is a nitrogen atom.

The nitrogen-containing, heteroaromatic compound is not particularly limited, but examples thereof include an azole compound, a pyridine compound, a pyrazine compound, and a pyrimidine compound.

The azole compound is a compound having a hetero-5-membered ring that includes at least one nitrogen atom and has aromaticity. The number of nitrogen atoms included in the hetero-5-membered ring of the azole compound is not particularly limited, and is preferably 2 to 4, more preferably 3 or 4.

In addition, all of these azole compounds may have substituents on the hetero-5-membered ring. Examples of such a substituent include a hydroxy group, a carboxy group, a mercapto group, an amino group, an alkyl group having 1 to 4 carbon atoms, which may have an amino group, and a 2-imidazolyl group.

Examples of the azole compound include an imidazole compound, a pyrazole compound, a thiazole compound, a triazole compound, and a tetrazole compound.

Examples of the imidazole compound include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazole carboxylic acid, histamine, benzoimidazole, 2-aminobenzoimidazole, and adenine.

Examples of the pyrazole compound include pyrazole, 4-pyrazolecarboxylic acid, 1-methylpyrazole, 3-methylpyrazole, 3-amino-5-hydroxypyrazole, 3-amino-5-methylpyrazole, 3-aminopyrazole, and 4-aminopyrazole.

Examples of the thiazole compound include 2,4-dimethylthiazole, benzothiazole, and 2-mercaptobenzothiazole.

Examples of the triazole compound include 1,2,4-triazole, 3-methyl-1,2,4-triazole, 3-amino-1,2,4-triazole, 1,2,3-triazole, 1-methyl-1,2,3-triazole, benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole, and 5-methyl-11H-benzotriazole.

Examples of the tetrazole compound include 1H-tetrazole (1,2,3,4-tetrazole), 5-methyl-1,2,3,4-tetrazole, 5-amino-1,2,3,4-tetrazole (5-aminotetrazole), 1,5-pentamethylenetetrazole, 1-phenyl-5-mercaptotetrazole, and 1-(2-dimethylaminoethyl)-5-mercaptotetrazole.

As the azole compound, the tetrazole compound, the triazole compound, the imidazole compound, or the pyrazole compound is preferable, and 5-aminotetrazole, benzotriazole, 5-methyl-1H-benzotriazole, or 3-aminopyrazole is more preferable.

The pyridine compound is a compound having a hetero-6-membered ring (pyridine ring) that includes one nitrogen atom and has aromaticity.

Examples of the pyridine compound include pyridine, 3-aminopyridine, 4-aminopyridine, 3-hydroxypyridine, 4-hydroxypyridine, 2-acetamidopyridine, 2-cyanopyridine, 2-carboxypyridine, and 4-carboxypyridine.

The pyrazine compound is a compound having aromaticity and having a hetero-6-membered ring (pyrazine ring) including two nitrogen atoms located at the para positions, and the pyrimidine compound is a compound having aromaticity and having a hetero-6-membered ring (pyrimidine ring) including two nitrogen atoms located at the meta positions.

Examples of the pyrazine compound include pyrazine, 2-methylpyrazine, 2,5-dimethylpyrazine, 2,3,5-trimethylpyrazine, 2,3,5,6-tetramethylpyrazine, 2-ethyl-3-methylpyrazine, and 2-amino-5-methylpyrazine.

Examples of the pyrimidine compound include pyrimidine, 2-methylpyrimidine, 2-aminopyrimidine, and 4,6-dimethylpyrimidine, and 2-aminopyrimidine is preferable.

As the heteroaromatic compound, the azole compound or the pyrazine compound is preferable, the azole compound is more preferable, and at least one selected from the group consisting of the tetrazole compound, the triazole compound, the imidazole compound, and the pyrazole compound is still more preferable.

The heteroaromatic compound may be used alone or in combination of two or more kinds thereof.

In a case where the cleaning liquid includes a heteroaromatic compound, the content of the heteroaromatic compound in the cleaning liquid is not particularly limited, but is preferably 0.0000001% to 0.05% by mass, and more preferably 0.0000005% to 0.01% by mass with respect to the total mass of the cleaning liquid.

In a case where the cleaning liquid includes a heteroaromatic compound, the content of the heteroaromatic compound is preferably 0.1% to 20% by mass, and more preferably 1% to 15% by mass with respect to the total solid content of the cleaning liquid.

(Ascorbic Acid Compound)

The ascorbic acid compound means at least one selected from the group consisting of ascorbic acid, an ascorbic acid derivative, and salts thereof.

Examples of the ascorbic acid derivative include an ascorbic acid phosphoric acid ester and an ascorbic acid sulfuric acid ester.

As the ascorbic acid compound, the ascorbic acid, the ascorbic acid phosphoric acid ester, or the ascorbic acid sulfuric acid ester is preferable, and the ascorbic acid is more preferable.

(Catechol Compound)

The catechol compound means at least one selected from the group consisting of pyrocatechol (benzene-1,2-diol) and a catechol derivative.

The catechol derivative means a compound in which at least one substituent is substituted in pyrocatechol. As the substituent contained in the catechol derivative, a hydroxy group, a carboxy group, a carboxylic acid ester group, a sulfo group, a sulfonic acid ester group, an alkyl group (preferably having 1 to 6 carbon atoms, and more preferably having 1 to 4 carbon atoms), and an aryl group (preferably a phenyl group). The carboxy group and the sulfo group contained as a substituent in the catechol derivative may be a salt of a cation. In addition, the alkyl group and the aryl group contained as a substituent in the catechol derivative may further have a substituent.

Examples of the catechol compound include pyrocatechol, 4-tert-butylcatechol, pyrogallol, gallate, methyl gallate, 1,2,4-benzenetriol, and Tyrone.

(Hydrazide Compound)

The hydrazide compound means a compound having a hydroxy group of an acid substituted with a hydrazino group (—NH—NH$_2$), and a derivative thereof (a compound having at least one substituent substituted in a hydrazino group).

The hydrazide compound may have two or more hydrazino groups.

Examples of the hydrazide compound include carboxylic acid hydrazide and sulfonic acid hydrazide, and carbohydrazide (CHZ) is preferable.

(Reducing Sulfur Compound)

The reducing sulfur compound is a compound that has reducing properties and includes a sulfur atom. Examples of the reducing sulfur compound include mercaptosuccinic acid, dithiodiglycerol, bis(2,3-dihydroxypropylthio)ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Among those, a compound having an SH group (mercapto compound) is preferable, and 1-thioglycerol, sodium 3-mercapto-1-propanesulfonate, 2-mercaptoethanol, 3-mercapto-1-propanol, or thioglycolic acid is more preferable.

(Polymer Compound)

The cleaning liquid may include a polymer compound as the anticorrosive agent.

As the polymer compound, an anionic polymer compound is preferable. The anionic polymer compound is a compound that has an anionic group and has a weight-average molecular weight of 1,000 or more. In addition, the anionic polymer compound does not include a compound that functions as an anionic surfactant which will be described later.

Examples of the anionic polymer compound include a polymer having a monomer having a carboxyl group as a basic constitutional unit and a salt thereof, and a copolymer including them. More specific examples of the anionic polymer compound include a polyacrylic acid and a salt thereof, and a copolymer including them; a polymethacrylic acid and a salt thereof, and a copolymer including them; a polyamic acid and a salt thereof, and a copolymer including them; and polycarboxylic acids such as polymaleic acid, polyitaconic acid, polyfumaric acid, poly(p-styrenecarboxylic acid), and polyglioxylic acid, and a salt thereof, and a copolymer including them.

Among those, at least one selected from the group consisting of a copolymer including polyacrylic acid, polymethacrylic acid, polyacrylic acid and polymethacrylic acid, and a salt thereof is preferably included.

Incidentally, the anionic polymer compound may be ionized in the cleaning liquid.

A weight-average molecular weight of the polymer compound is preferably 1.000 to 100,000, more preferably 2,000 to 50,000, and still more preferably 5,000 to 50,000.

The weight-average molecular weight of the polymer compound is a polystyrene-equivalent value obtained by a gel permeation chromatography (GPC) method. The GPC method is based on a method using HLC-8020GPC (manufactured by Tosoh Corporation), and using TSKgel SuperHZM-H, TSKgel SuperHZ4000, and TSKgel SuperHZ2000 (manufactured by Tosoh Corporation, 4.6 mm ID×15 cm) as columns and tetrahydrofuran (THF) as an eluent.

The polymer compound may be used alone or in combination of two or more kinds thereof.

The content of the polymer compound is preferably 0.0001% by mass or more, and more preferably 0.001% by mass or more with respect to the total mass of the cleaning liquid. The upper limit value of the content of the polymer compound is preferably 0.1% by mass or less, more preferably 0.05% by mass or less, and still more preferably 0.01% by mass or less with respect to the total mass of the cleaning liquid.

In a case where the cleaning liquid includes a polymer compound, the content of the polymer compound is preferably 0.1% to 20% by mass, and more preferably 1% to 15% by mass with respect to the total solid content of the cleaning liquid.

(Clathrate Compound)

The cleaning liquid may include a clathrate compound as the anticorrosive agent. In the present specification, the "clathrate compound" means a so-called host compound having a space in which a compound such as an organic compound and fine solid particles can be incorporated into the molecule.

Examples of the clathrate compound include cyclodextrin. Examples of the cyclodextrin include α-cyclodextrin, β-cyclodextrin and γ-cyclodextrin, and γ-cyclodextrin is preferable.

Furthermore, as the clathrate compound, the compound described in JP2008-210990A, the contents of which are incorporated herein by reference, can be used.

The cleaning liquid may include another anticorrosive agent other than the respective components.

Examples of such another anticorrosive agent include a hydroxylamine compound selected from hydroxylamine (NH$_2$OH), a hydroxylamine derivative, and salts thereof, sugars such as fructose, glucose and ribose, polyols such as ethylene glycol, propylene glycol, and glycerin, polyvinylpyrrolidone, cyanuric acid, barbituric acid and a derivative thereof, glucuronic acid, squaric acid, α-ketoic acid, adenosine and a derivative thereof, a purine compound and a derivative thereof, phenanthroline, resorcinol, nicotine amide and a derivative thereof, flavonol and a derivative thereof, anthocyanin and a derivative thereof, and a combination thereof.

The cleaning liquid preferably includes a heteroaromatic compound, an anionic polymer compound, or a clathrate compound, and more preferably includes the heteroaromatic compound, as the anticorrosive agent.

The anticorrosive agent may be used alone or in combination of two or more kinds thereof.

In a case where the cleaning liquid includes an anticorrosive agent, the content of the anticorrosive agent is not particularly limited, but is preferably 0.0000001% to 0.1% by mass, and more preferably 0.000005% to 0.03% by mass with respect to the total mass of the cleaning liquid.

In a case where the cleaning liquid includes an anticorrosive agent, the content of the anticorrosive agent is preferably 0.1% to 20% by mass, and more preferably 1% to 15% by mass with respect to the total solid content of the cleaning liquid.

Furthermore, as these anticorrosive agents, commercially available ones may be used, or those synthesized according to a known method may be used.

<Surfactant>

It is preferable that the cleaning liquid includes a surfactant from the viewpoint that the effect of the present invention is more excellent.

The surfactant is not particularly limited as long as it is a compound having a hydrophilic group and a hydrophobic group (parent oil group) in the molecule, and examples thereof include an anionic surfactant, a cationic surfactant, a nonionic surfactant, and an amphoteric surfactant.

The surfactant often has a hydrophobic group selected from an aliphatic hydrocarbon group, an aromatic hydrocarbon group, and a combination thereof. The hydrophobic group contained in the surfactant is not particularly limited, but in a case where the hydrophobic group includes an aromatic hydrocarbon group, it has preferably 6 or more carbon atoms, and more preferably has 10 or more carbon atoms. In a case where the hydrophobic group does not include an aromatic hydrocarbon group and is composed only of an aliphatic hydrocarbon group, it preferably has 10 or more carbon atoms, more preferably has 12 or more carbon atoms, and still more preferably has 16 or more carbon atoms. The upper limit value of the number of carbon atoms of the hydrophobic group is not particularly limited, but is preferably 20 or less, and more preferably 18 or less.

(Anionic Surfactant)

Examples of the anionic surfactant included in the cleaning liquid include phosphoric acid ester-based surfactants having a phosphoric acid ester group, phosphonic acid-based surfactants having a phosphonic acid group, sulfonic acid-based surfactants having a sulfo group, carboxylic acid-based surfactants having a carboxy group, and sulfuric acid ester-based surfactants having a sulfuric acid ester group, respectively, as a hydrophilic group (acid group).

The cleaning liquid preferably includes an anionic surfactant from the viewpoint that the cleaning performance and the corrosion prevention performance are more excellent.

—Phosphoric Acid Ester-Based Surfactant—

Examples of the phosphoric acid ester-based surfactants include a phosphoric acid ester (an alkyl ether phosphoric acid ester and an aryl ether phosphoric acid ester), a polyoxyalkylene other phosphoric acid ester (a polyoxyalkylene alkyl ether phosphoric acid ester and a polyoxyalkylene aryl ether phosphoric acid ester), and salts thereof. The phosphoric acid ester and the polyoxyalkylene ether phosphoric acid ester often include both a monoester and a diester, but such the monoester and diester can each be used alone.

Examples of the salt of the phosphoric acid ester-based surfactant include a sodium salt, a potassium salt, an ammonium salt, and an organic amine salt.

The monovalent alkyl group contained in the phosphoric acid ester and the polyoxyalkylene ether phosphoric acid ester is not particularly limited, but is preferably an alkyl group having 2 to 24 carbon atoms, more preferably an alkyl group having 6 to 18 carbon atoms, and still more preferably an alkyl group having 12 to 18 carbon atoms.

The monovalent aryl group contained in the phosphoric acid ester and the polyoxyalkylene ether phosphoric acid ester is not particularly limited, but is preferably an aryl group having 6 to 14 carbon atoms, which may have an alkyl group, more preferably a phenyl group or naphthyl group which may have an alkyl group, and still more preferably a phenyl group which may have an alkyl group.

The divalent alkylene group contained in the polyoxyalkylene ether phosphoric acid ester is not particularly limited, but is preferably an alkylene group having 2 to 6 carbon atoms, and more preferably an ethylene group or a 1,2-propanediyl group. In addition, the number of repetitions of the oxyalkylene group in the polyoxyalkylene ether phosphoric acid ester is preferably 1 to 12, and more preferably 3 to 10.

As the phosphoric acid ester-based surfactant, an octyl phosphoric acid ester, a lauryl phosphoric acid ester, a tridecyl phosphoric acid ester, a myristyl phosphoric acid ester, a cetyl phosphoric acid ester, a stearyl phosphoric acid ester, a polyoxyethylene octyl ether phosphoric acid ester, a polyoxyethylene lauryl ether phosphoric acid ester, a polyoxyethylene tridecyl ether phosphoric acid ester, or a polyoxyethylene dimethylphenyl ether phosphoric acid ester is preferable.

As the phosphoric acid ester-based surfactant, the compounds described in paragraphs [0012] to [0019] of JP2011-040502A, the contents of which are incorporated herein by reference, can also be used.

—Phosphonic Acid-Based Surfactant—

Examples of the phosphonic acid-based surfactant include alkylphosphonic acid, polyvinylphosphonic acid, and the aminomethylphosphonic acid described in JP2012-057108A.

—Sulfonic Acid-Based Surfactant—

Examples of the sulfonic acid-based surfactant include alkyl sulfonic acid, alkyl benzene sulfonic acid, alkyl naphthalene sulfonic acid, alkyl diphenyl ether disulfonic acid, alkyl methyl taurine, sulfosuccinic acid diester, polyoxyalkylene alkyl ether sulfonic acid, and salts thereof The monovalent alkyl group contained in the sulfonic acid-based surfactant is not particularly limited, but is preferably an alkyl group having 10 or more carbon atoms, and more preferably an alkyl group having 12 or more carbon atoms. The upper limit value is not particularly limited, but is preferably 24 or less.

Moreover, the divalent alkylene group contained in the polyoxyalkylene alkyl ether sulfonic acid is not particularly limited, but is preferably an ethylene group or a 1,2-propanediyl group. In addition, the number of repetitions of the oxyalkylene group in the polyoxyalkylene alkyl ether sulfonic acid is preferably 1 to 12, and more preferably 1 to 6.

Specific examples of the sulfonic acid-based surfactant include hexane sulfonic acid, octane sulfonic acid, decane sulfonic acid, dodecane sulfonic acid, toluene sulfonic acid, cumene sulfonic acid, octylbenzene sulfonic acid, dodecylbenzenesulfonic acid (DBSA), dinitrobenzene sulfonic acid (DNBSA), and lauryldodecylphenyl ether disulfonic acid (LDPEDSA), —Carboxylic Acid-Based Surfactant—

Examples of the carboxylic acid-based surfactant include an alkylcarboxylic acid, an alkylbenzenecarboxylic acid, a polyoxyalkylene alkyl ether carboxylic acid, and salts thereof.

The monovalent alkyl group contained in the above-mentioned carboxylic acid-based surfactant is not particularly limited, but is preferably an alkyl group having 7 to 25 carbon atoms, and more preferably an alkyl group having 11 to 17 carbon atoms.

The divalent alkylene group contained in the polyoxyalkylene alkyl ether carboxylic acid is not particularly limited, but is preferably an ethylene group or a 1,2-propanediyl group. In addition, the number of repetitions of the oxyalkylene group in the polyoxyalkylene alkyl ether carboxylic acid is preferably 1 to 12, and more preferably 1 to 6.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

—Sulfuric Acid Ester-Based Surfactant—

Examples of the sulfuric acid ester-based surfactant include a sulfuric acid ester (alkyl ether sulfuric acid ester), a polyoxyalkylene ether sulfuric acid ester, and salts thereof.

The monovalent alkyl group contained in the sulfuric acid ester and the polyoxyalkylene ether sulfuric acid ester is not particularly limited, but is preferably an alkyl group having 2 to 24 carbon atoms, and more preferably an alkyl group having 6 to 18 carbon atoms.

The divalent alkylene group contained in the polyoxyalkylene ether sulfuric acid ester is not particularly limited, but is preferably an ethylene group or a 1,2-propanediyl group. In addition, the number of repetitions of the oxyalkylene group in the polyoxyalkylene ether sulfuric acid ester is preferably 1 to 12, and more preferably 1 to 6.

Specific examples of the sulfuric acid ester-based surfactant include a lauryl sulfuric acid ester, a myristyl sulfuric acid ester, and a polyoxyethylene lauryl ether sulfuric acid ester.

As the anionic surfactant, the phosphoric acid ester-based surfactant, the sulfonic acid-based surfactant, the phosphonic acid-based surfactant, or the carboxylic acid-based surfactant is preferable, and the phosphoric acid ester-based surfactant is more preferable.

These anionic surfactant may be used alone or in combination of two or more kinds thereof.

In a case where the cleaning liquid includes an anionic surfactant, the content of the anionic surfactant is preferably 0.000001% to 0.05% by mass, more preferably 0.000005% to 0.005% by mass, still more preferably 0.00001% to 0.001% by mass, and particularly preferably 0.00005% to 0.0005% by mass with respect to the total mass of the cleaning liquid.

In a case where the cleaning liquid includes an anionic surfactant, the content of the anionic surfactant is preferably 0.001% to 20% by mass, more preferably 0.008% to 3% by mass, still more preferably 0.02% to 1% by mass, and particularly preferably 0.05% to 0.5% by mass with respect to the total solid content of the cleaning liquid.

Furthermore, as these anionic surfactants, commercially available ones may be used.

(Cationic Surfactant)

Examples of the cationic surfactant include primary to tertiary alkylamine salts (for example, monostearylammonium chloride, distearylammonium chloride, and tristearylammonium chloride), and modified aliphatic polyamines (for example, polyethylene polyamine).

) (Nonionic Surfactant)

Examples of the nonionic surfactant include polyoxyalkylene alkyl ethers (for example, polyoxyethylene stearyl ether and polyoxyethylene lauryl ether), polyoxyalkylene alkenyl ethers (for example, polyoxyethylene oleyl ether), polyoxyethylene alkylphenyl ethers (for example, polyoxyethylene nonylphenyl ether), polyoxyalkylene glycol (for example, polyoxypropylene polyoxyethylene glycol), polyoxyalkylene monoalkylates (monoalkyl fatty acid ester polyoxyalkylene) (for example, polyoxyethylene monoalkylates such as polyoxyethylene monostearate and polyoxyethylene monooleate), polyoxyalkylene dialkylates (dialkyl fatty acid ester polyoxyalkylene) (for example, polyoxyethylene dialkylates such as polyoxyethylene distearate and polyoxyethylene diolate), bispolyoxyalkylene alkylamides (for example, bispolyoxyethylene stearylamide), a sorbitan fatty acid ester, a polyoxyethylene sorbitan fatty acid ester, a polyoxyethylene alkylamine, a glycerin fatty acid ester, an oxyethylene oxypropylene block copolymer, an acetylene glycol-based surfactant, and an acetylene-based polyoxyethylene oxide.

As the nonionic surfactant, the polyoxyalkylene alkyl ether is preferable, and the polyoxyethylene stearyl ether or the polyoxyethylene lauryl ether is more preferable.

(Amphoteric Surfactant)

Examples of the amphoteric surfactant include carboxybetaine (for example, alkyl-N,N-dimethylaminoacetic acid betaine and alkyl-N,N-dihydroxyethylaminoacetic acid betaine), sulfobetaine (for example, alkyl-N,N-dimethylsulfoethyleneammonium betaine), and imidazolinium betaine (for example, 2-alkyl-N-carboxymethyl-N-hydroxyethyl imidazolinium betaine).

As the surfactant, the compounds described in paragraphs [0092] to [0096] of JP2015-158662A, paragraphs [0045] and [0046] of JP2012-151273A, and paragraphs [0014] to [0020] of JP2009-147389A, the contents of which are incorporated herein by reference, can also be used.

The surfactant may be used alone or in combination of two or more kinds thereof. In a case where the cleaning liquid includes a surfactant, the content of the surfactant is preferably 0.000001% to 0.05% by mass, more preferably 0.000005% to 0.005% by mass, still more preferably 0.00001% to 0.001% by mass, and particularly preferably 0.00005% to 0.0005% by mass with respect to the total mass of the cleaning liquid from the viewpoint that the effect of the present invention is more excellent.

In a case where the cleaning liquid includes a surfactant, a mass ratio of the content of the component A to the content of the surfactant (the content of the component A/the content of the surfactant) is preferably 0.1 to 2,000, more preferably 0.3 to 1,000, still more preferably 1 to 500, particularly preferably 5 to 300, and most preferably 10 to 100 from the viewpoint that the effect of the present invention is more excellent.

In addition, in a case where the cleaning liquid includes an anionic surfactant, the content of the anionic surfactant is preferably 0.001% to 20% by mass, more preferably 0.01% to 15% by mass, and still more preferably 0.05 to 15% by mass with respect to the total solid content of the cleaning liquid.

<Specific Chelating Agent>

The cleaning liquid may include a specific chelating agent in which a coordinating group has a nitrogen-containing group. The specific chelating agent has two or more nitrogen-containing groups as a coordination group that coordinates with metal ions in one molecule. Examples of the nitrogen-containing group which is a coordination group include an amino group.

Examples of the specific chelating agent include a biguanide compound which is a compound having a biguanide group or a salt thereof. The number of biguanide groups contained in the biguanide compound is not particularly limited, and the biguanide compound may have a plurality of biguanide groups.

Examples of the biguanide compound include the compounds described in paragraphs [0034] to [0055] of JP2017-504190A, the contents of which are incorporated herein by reference.

As the compounds having a biguanide group, ethylene dibiguanide, propylene dibiguanide, tetramethylene dibiguanide, pentamethylene dibiguanide, hexamethylene dibiguanide, heptamethylene dibiguanide, octamethylene dibiguanide, 1,1'-hexamethylenebis(5-(p-chlorophenyl)biguanide)(chlorhexidine), 2-(benzyloxymethyl)pentane-1,5-bis(5-hexylbiguanide), 2-(phenylthiomethyl)pentane-1,5-bis(5-phenetylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), or 3-(benzylthio)hexane-1,6-bis(5-cyclohexylbiguanide) is preferable, and chlorhexidine is more preferable.

As the salt of the compound having a biguanide group, hydrochloride, acetate or gluconate is preferable, and gluconate is more preferable.

As the specific chelating agent, chlorhexidine gluconate (CHG) is preferable.

The specific chelating agent may be used alone or in combination of two or more kinds thereof.

The content of the specific chelating agent in the cleaning liquid is not particularly limited, but is preferably 0.01% to 10% by mass, and more preferably 0.05% to 5% by mass with respect to the total mass of the cleaning liquid.

<Oxidizing Agent>

The cleaning liquid may include an oxidizing agent.

Examples of the oxidizing agent include hydrogen peroxide, peroxide, nitric acid and a salt thereof, iodic acid and a salt thereof, periodic acid and a salt thereof, hypochlorous acid and a salt thereof, chloric acid and a salt thereof, chloric acid and a salt thereof, perchloric acid and a salt thereof, persulfuric acid and a salt thereof, permanganic acid and a salt thereof, permanganic acid and a salt thereof, ozone water, a silver (11) salt, and an iron (Ill) salt.

As the oxidizing agent included in the cleaning liquid, hydrogen peroxide, or periodic acid or a salt thereof is preferable.

The oxidizing agent may be used alone or in combination of two or more kinds thereof.

In a case where the cleaning liquid includes an oxidizing agent, the content of the oxidizing agent is preferably 0.00001% to 0.01% by mass, and more preferably 0.00005% to 0.003% by mass with respect to the total mass of the cleaning liquid.

In a case where the cleaning liquid includes an oxidizing agent, the content of the oxidizing agent is preferably 0.1% to 20% by mass, and more preferably 0.5% to 10% by mass with respect to the total solid content of the cleaning liquid.

<Additive>

The cleaning liquid may include an additive other than the components, as desired. Examples of such an additive include a pH adjuster, a chelating agent (excluding the organic acid and the specific chelating agent), a fluorine compound, and an organic solvent.

(pH Adjuster)

The cleaning liquid may include a pH adjuster to adjust and maintain the pH of the cleaning liquid. Examples of the pH adjuster include a basic compound and an acidic compound other than the components.

Examples of the basic compound include a basic inorganic compound. In addition, in order to raise the pH of the cleaning liquid, the organic alkali may be used.

Examples of the basic inorganic compound include an alkali metal hydroxide, an alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

As these basic compounds, commercially available ones may be used, or those appropriately synthesized by a known method may be used.

Examples of the acidic compound include an inorganic acid. In addition, in order to lower the pH of the cleaning liquid, the organic acid and the anionic surfactant may be used.

Examples of the inorganic acid include hydrochloric acid, sulfuric acid, sulfurous acid, nitric acid, nitrite, phosphoric acid, boric acid, and hexafluorophosphoric acid. In addition, a salt of the inorganic acid may be used, and examples thereof include an ammonium salt of the inorganic acid, and more specifically, ammonium chloride, ammonium sulfate, ammonium sulfite, ammonium nitrate, ammonium nitrite, ammonium phosphate, ammonium borate, and ammonium hexafluoride phosphate.

As the inorganic acid, phosphoric acid or phosphate is preferable, and phosphoric acid is more preferable.

As the acidic compound, a salt of the acidic compound may be used as long as it is an acid or an acid ion (anion) in an aqueous solution.

As the acidic compound, commercially available ones may be used, or those appropriately synthesized by a known method may be used.

The pH adjuster may be used alone or in combination of two or more kinds thereof.

In a case where the cleaning liquid includes a pH adjuster, the content of the pH adjuster is selected according to types and amounts of other components, and the pH of a target cleaning liquid, and is preferably 0.0001% to 0.03% by mass, and more preferably 0.0005% to 0.01% by mass with respect to the total mass of the cleaning liquid.

The cleaning liquid may include another chelating agent other than an organic acid having a chelating function and the specific chelating agent. Examples of such another chelating agent include inorganic acid-based chelating agents such as a fused phosphoric acid and a salt thereof. Examples of the fused phosphoric acid and a salt thereof include pyrophosphoric acid and a salt thereof, metaphosphoric acid and a salt thereof, tripolyphosphoric acid and a salt thereof, and hexametaphosphoric acid and a salt thereof.

Examples of the fluorine compound include the compounds described in paragraphs [0013] to 100151 of JP2005-150236A, the contents of which are incorporated herein by reference.

The amount of such another chelating agent and the fluorine compound used is not particularly limited, and can be appropriately set as long as the effect of the present invention is not impaired.

The cleaning liquid may include an organic solvent. The organic solvent is preferably a water-soluble organic solvent. The expression that the organic solvent is water-soluble means that water and the organic solvent at 25° C. can be mixed (dissolved) at any ratio.

Examples of the organic solvent include an alcohol-based solvent, a ketone-based solvent, an ester-based solvent, an ether-based solvent (for example, a glycol diether), a sulfone-based solvent, a sulfoxide-based solvent, a nitrile-based solvent, and an amide-based solvent. These solvents may be water-soluble.

The organic solvent may be used alone or in combination of two or more kinds thereof.

The content of each of the components in the cleaning liquid is can be measured by a known method such as gas chromatography-mass spectrometry (GC-MS) or liquid chromatography-mass spectrometry (LC-MS), and ion-exchange chromatography (1C).

[Physical Properties of Cleaning Liquid]

<pH>

The pH of the cleaning liquid of the embodiment of the present invention is 7.0 to 11.8 at 25° C.

The pH of the cleaning liquid is preferably more than 7.0, more preferably 7.5 or more, and still more preferably 8.0 or more at 25° C. from the viewpoint that the effect of the present invention is more excellent. The upper limit value is not particularly limited, but is preferably 11.5 or less, more preferably 11.0 or less, and still more preferably 10.5 or less at 25° C. from the viewpoint that the effect of the present invention is more excellent.

The pH of the cleaning liquid can be adjusted by using the pH adjuster and a component having a function of a pH adjuster, such as the organic acid, organic alkali, heteroaromatic compound, and anionic surfactant.

<Metal Content>

In the cleaning liquid, the content of metals (metal elements of Fe, Co, Na, K, Cu, Mg, Mn, Li, Al, Cr, Ni, Zn, Sn, and Ag) included as impurities in the liquid (ion concentration) is preferably 5 ppm by mass or less, and more preferably 1 ppm by mass or less. The lower limit value is not particularly limited, but is preferably 0.

Examples of a method for reducing the metal content include performing a purifying treatment such as distillation and filtration using an ion exchange resin or a filter at a stage of raw materials before use in the production of the cleaning liquid or a stage after the production of the cleaning liquid.

Other examples of the method for reducing the metal content include using a container with less elution of impurities, which will be described later, as a container that accommodates the raw material or the produced cleaning liquid. In addition, other examples of the method include lining an inner wall of a pipe with a fluorine-based resin so that the metal component does not elute from the pipe during the production of the cleaning liquid.

<Coarse Particles>

The cleaning liquid may include coarse particles, but the content of the cleaning liquid is preferably low. Here, the coarse particles mean particles having a diameter (particle diameter) of 0.4 μm or more in a case where the shape of the particles is regarded as a sphere.

As for the content of the coarse particles in the cleaning liquid, the content of the particles having a particle diameter of 0.4 μm or more is preferably 1,000 or less, and more preferably 500 or less per mL of the cleaning liquid. The lower limit value is not particularly limited, and may be 0. In addition, it is more preferable that the content of particles having a particle diameter of 0.4 μm or more measured by the measuring method is no more than a detection limit.

The coarse particles included in the cleaning liquid correspond to particles of dirt, dust, organic solids, inorganic solids, and the like included as impurities in raw materials, and particles of dirt, dust, and organic solids, and inorganic solids brought in as contaminants during the preparation of the cleaning liquid, in which the particles are finally present as particles without being dissolved in the cleaning liquid.

The content of the coarse particles present in the cleaning liquid can be measured in a liquid phase by using a commercially available measuring device in a light scattering type liquid particle measuring method using a laser as a light source.

Examples of a method for removing the coarse particles include a purifying treatment such as filtering which will be described later.

[Kit and Concentrate]

The cleaning liquid may be used as a kit for preparing the cleaning liquid by dividing the raw material into a plurality of parts. As a specific method using the cleaning liquid as a kit, for example, an aspect in which in a case where the cleaning liquid includes the component A, water, and an optional component, a liquid composition including water and the optional component is prepared as a first liquid, and a liquid composition including the component A is prepared as a second liquid may be mentioned.

The content of each component included in the first liquid and the second liquid provided in the kit is not particularly limited, but the content of each component in the cleaning liquid prepared by mixing the first liquid and the second liquid is preferably an amount corresponding to the preferred amount described above.

The pH's of the first liquid and the second liquid provided in the kit are not particularly limited, and each of the pH's may be adjusted so that the pH of a cleaning liquid prepared by mixing the first liquid and the second liquid is within in the range of 7.0 to 11.8.

In addition, the cleaning liquid may be prepared as a concentrated solution. In this case, it can be diluted with a diluent liquid at the time of use. That is, a kit may include the cleaning liquid in the form of a concentrated solution and a diluent liquid.

[Manufacture of Cleaning Liquid]

The cleaning liquid can be produced by a known method. Hereinafter, a method for producing the cleaning liquid will be described in detail.

<Liquid Producing Step>

The method for producing a cleaning liquid is not particularly limited, and for example, a cleaning liquid can be produced by mixing the above-described respective components. The order and/or the timing of mixing the above-mentioned respective components is not particularly limited, and for example, a production method in which the component A and any components are added sequentially or simultaneously to a container to which purified pure water has been incorporated, and then the mixture is stirred and mixed while a pH adjuster is added to the mixture to adjust the pH of the mixed solution, thereby performing the preparation, may be mentioned. In addition, in a case where water and the respective components are added to the container, they may be added all at once or dividedly a plurality of times.

A stirring device and a stirring method used for producing a cleaning liquid are not particularly limited, and a known device as a stirrer or a disperser can be used. Examples of the stirrer include an industrial mixer, a portable stirrer, a mechanical stirrer, and a magnetic stirrer. Examples of the disperser include an industrial disperser, a homogenizer, an ultrasonic disperser, and bead mills.

The mixing of the respective components in the liquid producing step for the cleaning liquid, and a purifying treatment which will be described later and the storage of the produced cleaning liquid are preferably performed at 40° C. or lower, and more preferably at 30° C. or lower. In addition, the lower limit value of the storage temperature is preferably 5° C. or higher, more preferably 10° C. or higher. By producing, treating, and/or storing the cleaning liquid in the temperature range, stable performance can be maintained for a long period of time.

(Purifying Treatment)

It is preferable to subject any one or more of the raw materials for preparing the cleaning liquid to a purifying treatment in advance. The purifying treatment is not particularly limited, and examples thereof include known methods such as distillation, ion exchange, and filtration.

The degree of purification is not particularly limited, but it is preferable to perform the purification until a purity of the raw material is 99% by mass or more, and it is more preferable to perform the purification until the purity of the raw material is 99.9% by mass or more.

Specific examples of the method for the purifying treatment include a method of passing a raw material through an ion exchange resin or a reverse osmosis membrane (RO membrane), distillation of a raw material, and filtering which will be described later.

As the purifying treatment, a plurality of the above-mentioned purification methods may be combined and carried out. For example, the raw materials are subjected to primary purification by passing through an RO membrane, and then subjected to secondary purification by passing through a purification device consisting of a cation exchange resin, an anion exchange resin, or a mixed bed type ion exchange resin.

In addition, the purifying treatment may be carried out a plurality of times.

(Filtering)

A filter used for filtering is not particularly limited as long as it is the one that has been used for filtration in the related art. Examples thereof include a filter consisting of a fluorine-based resin such as polytetrafluoroethylene (PTFE) and a tetrafluoroethylene-perfluoroalkyl vinyl ether copolymer (PFA), a polyamide-based resin such as nylon, and a polyolefin resin (including a high-density polyolefin and an ultrahigh-molecular-weight polyolefin) such as polyethylene and polypropylene (PP). Among these materials, a material selected from the group consisting of the polyethylene, the polypropylene (including a high-density polypropylene), the fluorine-based resin (including PTFE and PFA), and the polyamide-based resin (including nylon) is preferable, and among these, the filter with the fluorine-based resin is more preferable. By performing filtering of the raw materials using a filter formed with these materials, high-polarity foreign matters which are likely to cause defects can be more effectively removed.

A critical surface tension of the filter is preferably 70 to 95 mN/m, and more preferably 75 to 85 mN/n. Further, the value of the critical surface tension of the filter is a nominal value of a manufacturer. By using a filter having a critical surface tension in the range, high-polarity foreign matters which are likely to cause defects can be more effectively removed.

The pore diameter of the filter is preferably 2 to 20 nm, and more preferably 2 to 15 am. By adjusting the pore diameter of the filter to be in the range, it is possible to reliably remove fine foreign matters such as impurities and aggregates included in the raw materials while suppressing clogging in filtering. With regard to the pore diameters herein, reference can be made to nominal values of filter manufacturers.

Filtering may be performed only once or twice or more. In a case where filtering is performed twice or more, the filters used may be the same as or different from each other.

Moreover, the filtering is preferably performed at room temperature (25° C.) or lower, more preferably performed at 23° C. or lower, and still more preferably performed at 20° C. or lower. In addition, the temperature is preferably 0° C. or higher, more preferably 5° C. or higher, and still more preferably 10° C. or higher. By performing filtering in the temperature range, the amount of particulate foreign matter and impurities dissolved in the raw material can be reduced, and the foreign matter and impurities can be efficiently removed.

(Container)

The cleaning liquid (including the aspect of the kit or a diluted cleaning liquid described below) can be filled in any container and stored, transported, and used as long as corrosiveness does not become a problem.

In semiconductor applications, as the container, a container that has a high degree of cleanliness inside the container, and suppresses elution of impurities from an inner wall of an accommodating portion of the container into each liquid is preferable. Examples of such a container include various containers commercially available as a container for a semiconductor treatment liquid, such as "Clean Bottle" series manufactured by AICELLO MILIM CHEMICAL Co., Ltd. and "Pure Bottle" manufactured by Kodama Plastics Co., Ltd., but the container is not limited thereto.

In addition, as the container for accommodating the cleaning liquid, a container in which a liquid contact portion with each liquid, such as an inner wall of the accommodating portion, is formed from a fluorine-based resin (perfluororesin) or a metal which has been subjected to rust prevention and metal elution prevention treatments is preferable.

The inner wall of the container is preferably formed from one or more resins selected from the group consisting of a polyethylene resin, a polypropylene resin, and a polyethylene-polypropylene resin, other resins, and a metal which has been rust prevention and metal elution preventing treatments, such as stainless steel, Hastelloy, Inconel, and Monel.

As such other resins, a fluorine-based resin (perfluororesin) is preferable. In this manner, by using a container having an inner wall formed of a fluorine-based resin, occurrence of a problem of elution of ethylene or propylene oligomers can be suppressed, as compared with a container having an inner wall formed of a polyethylene resin, a polypropylene resin, or a polyethylene-polypropylene resin.

Specific examples of such a container having an inner wall which is a fluorine-based resin include a Fluoro Pure PFA composite drum manufactured by Entegris Inc. In addition, the containers described on page 4 of JP1991-502677A (JP-103-502677A), page 3 of WO2004/016526A, and pages 9 and 16 of WO99/046309A can also be used.

Moreover, for the inner wall of the container, quartz and an electropolished metal material (that is, a completely electropolished metal material) are also preferably used, in addition to the above-mentioned fluorine-based resin.

The metal material used for producing the electropolished metal material is preferably a metal material which includes at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is more preferably 30% by mass or more with respect to the total mass of the metal material.

In addition, the upper limit value of the total content of Cr and Ni in the metal material is not particularly limited, but is preferably 90% by mass or less.

A method for electropolishing the metal material is not particularly limited, and electropolishing can be performed by a known method. For example, electropolishing with the methods described in paragraphs [0011] to [0014] of JP2015-227501A, paragraphs [0036] to [0042] of JP2008-264929A, or the like can be used.

The inside of these containers is preferably cleaned before the cleaning liquid is filled. For the liquid used for the cleaning, the amount of the metal impurities in the liquid is preferably reduced. The cleaning liquid may be bottled in a container such as a gallon bottle and a coated bottle after the production, and transported, and stored.

In order to prevent the change in the components in the cleaning liquid during the storage, the inside of the container may be replaced with inert gas (nitrogen, argon, or the like) with a purity of 99.99995% by volume or more. In particular, a gas having a low moisture content is preferable. In addition, during the transportation and the storage, the temperature may be controlled to a normal temperature in the range of −20° C. to 20° C. to prevent deterioration.

(Clean Room)

It is preferable that handlings including production of the cleaning liquid, opening and cleaning of a container, and filling of the cleaning liquid, treatment analysis, and measurements are all performed in a clean room. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

<Diluting Step>

From the viewpoint of raw materials and cost required for storage and transportation, it is preferable that a cleaning liquid in the form of a concentrated solution in which the content of a solvent such as water and an organic solvent is smaller than that at the time of use is prepared as the above-mentioned cleaning liquid, and subjected to a diluting step of performing dilution using a diluent such as water, and a cleaning liquid thus obtained is subjected to cleaning of a semiconductor substrate.

A dilution ratio of the cleaning liquid in the diluting step may be appropriately adjusted according to a type and a content of each component, and a semiconductor substrate as an object to be cleaned, but the ratio by volume of the dilution cleaning liquid to the cleaning liquid before dilution is preferably 10 to 10,000, more preferably 20 to 3,000, and still more preferably 50 to 1,000.

In addition, the cleaning liquid is preferably diluted with water from the viewpoint that it has more excellent defect inhibition performance.

In the cleaning liquid (hereinafter also referred to as a "concentrated cleaning liquid") in the aspect of the concentrated solution, the content of each component is preferably within the following range.

From the viewpoint that the effect of the present invention is more excellent, the content of the component A in the concentrated cleaning liquid is preferably 0.0001% by mass or more, more preferably 0.01% by mass or more, still more preferably 0.5% by mass or more, and particularly preferably 0.8% by mass or more with respect to the total mass of the concentrated cleaning liquid.

The upper limit value of the content of the component A is not particularly limited, but is preferably 20% by mass or less, more preferably 10% by mass or less, still more preferably 8% by mass or less, and particularly preferably 5% by mass or less with respect to the total mass of the concentrated cleaning liquid from the viewpoint that the particle removal performance is more excellent.

The content of water in the concentrated cleaning liquid may be a balance other than the component A and optional components which will be described later. The content of water, is, for example, preferably 1% by mass or more, more preferably 30% by mass or more, still more preferably 60% by mass or more, and particularly preferably 85% by mass or more with respect to the total mass of the concentrated cleaning liquid. The upper limit value is not particularly limited, but is preferably 99% by mass or less, and more preferably 95% by mass or less with respect to the total mass of the concentrated cleaning liquid.

The content of the carboxylic acid in the concentrated cleaning liquid is preferably 0.1% to 10% by mass, and more preferably 0.5% to 5% by mass with respect to the total mass of the concentrated cleaning liquid.

The content of the phosphonic acid in the concentrated cleaning liquid is preferably 2% by mass or less, and more preferably 1% by mass or less with respect to the total mass of the concentrated cleaning liquid. The lower limit value is not particularly limited, but is preferably 0.01% by mass or more, and more preferably 0.05% by mass or more with respect to the total mass of the concentrated cleaning liquid.

The content of the organic acid in the concentrated cleaning liquid is preferably 10% by mass or less, and more preferably 5% by mass or less with respect to the total mass of the concentrated cleaning liquid. The lower limit value is not particularly limited, but is preferably 0.01% by mass or more, and more preferably 0.03% by mass or more with respect to the total mass of the concentrated cleaning liquid.

The content of the amino alcohol in the concentrated cleaning liquid is preferably 0.01% by mass or more, more preferably 0.3% by mass or more, and still more preferably 0.8% by mass or more with respect to the total mass of the concentrated cleaning liquid from the viewpoint that the effect of the present invention is more excellent. The upper limit value is not particularly limited, but is preferably 20% by mass or less, more preferably 8% by mass or less, and still more preferably 4% by mass or less with respect to the total mass of the concentrated cleaning liquid from the viewpoint that the effect of the present invention is more excellent.

The content of the amine compound in the concentrated cleaning liquid is preferably 0.01% by mass or more, more preferably 0.3% by mass or more, and still more preferably 0.8% by mass or more with respect to the total mass of the concentrated cleaning liquid. The upper limit value is not particularly limited, but is preferably 20% by mass or less, more preferably 8% by mass or less, and still more preferably 4% by mass or less with respect to the total mass of the concentrated cleaning liquid.

The content of the quaternary ammonium compound in the concentrated cleaning liquid is preferably 0.001% to 20% by mass, and more preferably 0.01% to 10% by mass with respect to the total mass of the concentrated cleaning liquid.

The content of the organic alkali in the concentrated cleaning liquid is preferably 0.0010% to 20% by mass, and more preferably 0.01% to 10% by mass with respect to the total mass of the concentrated cleaning liquid.

The content of the heteroaromatic compound in the concentrated cleaning liquid is preferably 0.00001% to 5% by mass, and more preferably 0.00005% to 1% by mass with respect to the total mass of the concentrated cleaning liquid.

The content of the polymer compound in the concentrated cleaning liquid is preferably 0.01% by mass or more, and more preferably 0.1% by mass or more with respect to the total mass of the concentrated cleaning liquid. The upper limit value is not particularly limited, but is preferably 10% by mass or less, more preferably 5% by mass or less, and still more preferably 1% by mass or less with respect to the total mass of the concentrated cleaning liquid.

The content of the anticorrosive agent in the concentrated cleaning liquid is preferably 0.00001% to 10% by mass, and more preferably 0.0005% to 3% by mass with respect to the total mass of the concentrated cleaning liquid.

The content of the anionic surfactant in the concentrated cleaning liquid is preferably 0.0001% to 5.0% by mass, more preferably 0.0005% to 0.5% by mass, still more preferably 0.001% to 0.1% by mass, and particularly preferably 0.005% to 0.05% by mass with respect to the total mass of the concentrated cleaning liquid from the viewpoint that the effect of the present invention is more excellent.

The content of the surfactant in the concentrated cleaning liquid is preferably 0.0001% to 5.0% by mass, more preferably 0.0005% to 0.5% by mass, still more preferably 0.001% to 0.1% by mass, and particularly preferably 0.005% to 0.05% by mass with respect to the total mass of the concentrated cleaning liquid from the viewpoint that the effect of the present invention is more excellent.

The content of the oxidizing agent in the concentrated cleaning liquid is preferably 0.001% to 1% by mass, and more preferably 0.005% to 0.3% by mass with respect to the total mass of the concentrated cleaning liquid.

The content of the pH adjuster in the concentrated cleaning liquid is selected according to types and amounts of other components, and the pH of a target concentrated cleaning liquid, and is preferably 0.01% to 3% by mass, and more preferably 0.05% to 1% by mass with respect to the total mass of the concentrated cleaning liquid.

The pH of the concentrated cleaning liquid is preferably 6.0 to 13.5 at 25° C. The pH of the concentrated cleaning liquid is more preferably 7.0 or more, and still more preferably 8.0 or more at 25° C. from the viewpoint that the effect of the present invention is more excellent. The upper limit value is not particularly limited, but is preferably 12.5 or less, and more preferably 11.5 or less at 25° C. from the viewpoint that the effect of the present invention is more excellent.

A change in a pH before and after dilution (a difference between the pH of the concentrated cleaning liquid and the pH of the diluted cleaning liquid) is preferably 1.0 or less, more preferably 0.8 or less, and still more preferably 0.5 or less.

A specific method for the diluting step of diluting the cleaning liquid is not particularly limited, and may be performed according to the above-mentioned liquid producing step for the cleaning liquid. The stirring device and the stirring method used in the diluting step are also not particularly limited, and the known stirring device mentioned in the liquid producing step for the cleaning liquid may be used to perform the dilution.

It is preferable to subject the water used in the diluting step to a purification step in advance. In addition, it is preferable to subject the diluted cleaning liquid obtained in the diluting step to a purifying treatment.

The purifying treatment is not particularly limited, and examples thereof include an ion component reducing treatment using an ion exchange resin or an RO membrane, and foreign matter removal using filtering, described as the above-mentioned purifying treatment for the cleaning liquid, and it is preferable to carry out any one of these treatments.

[Use]

The cleaning liquid can be used as a pCMP cleaning liquid for a semiconductor substrate to which CMP has been applied for removing residues on the semiconductor substrate.

In addition, the cleaning liquid can be used for cleaning a semiconductor substrate in a process of manufacturing a semiconductor substrate, and can also be used as a composition for a buffing treatment as described below.

[Method for Cleaning Semiconductor Substrate]

In a method for cleaning a semiconductor substrate using a cleaning liquid (hereinafter also simply referred to as "the present cleaning method"), the cleaning liquid can be used in contact with a semiconductor substrate (hereinafter also referred to as an "object to be treated") containing a metal-containing substance which is a material containing a metal. At this time, the object to be treated may contain a plurality of kinds of metal-containing substances.

[Object to Be Treated]

An object to be treated, which is an object of the present cleaning method, is not particularly limited as long as it has a metal-containing substance on the semiconductor substrate.

Furthermore, the expression "on the semiconductor substrate" in the present specification encompasses, for example, front and back surfaces, a side surface, and the inside of a groove of the semiconductor substrate. In addition, the metal-containing substance on the semiconductor substrate encompasses not only a case where the metal-containing substance is directly on a surface of the semiconductor substrate but also a case where the metal-containing substance is present on the semiconductor substrate via another layer.

The metal-containing substance is a material including a simple substance of a metal (metal atom) as a main component.

Examples of the metal included in the metal-containing substance include at least one metal M selected from the group consisting of copper (Cu), cobalt (Co), tungsten (W), titanium (Ti), tantalum (Ta), ruthenium (Ru), chromium (Cr), hafnium (Hf), osmium (Os), platinum (Pt), nickel (Ni), manganese (Mn), zirconium (Zr), molybdenum (Mo), lantern (La), and iridium (Ir).

The metal-containing substance only needs to be a substance containing a metal (metal atom), and examples thereof include a simple substance of the metal M, an alloy including the metal M, an oxide of the metal M, a nitride of the metal M, and an acid nitride of the metal M.

In addition, the metal-containing substance may be a mixture including two or more of these compounds.

Furthermore, the oxide, the nitride, and the oxynitride may be a composite oxide, a composite nitride, or a composite oxynitride, including a metal.

The content of the metal atom in the metal-containing substance is preferably 10% by mass or more, more preferably 30% by mass or more, and still more preferably 50% by mass or more with respect to the total mass of the metal-containing substance. The upper limit value is 100% by mass since the metal-containing substance may be the metal itself.

A form of the metal-containing substance is not particularly limited, and may be, for example, any of a film-like (layered) form, a wiring line-like form, and a particle-like form. The metal-containing substance may be arranged only on one main surface of the substrate, or may be arranged on both main surfaces. In addition, the metal-containing substance may be arranged on the whole main surface of the substrate, or may be arranged on a part of the main surface of the substrate.

The semiconductor substrate preferably has a metal M-containing substance including a metal M, more preferably has a metal-containing substance including at least one metal selected from the group consisting of Cu, Co, W, Ti, Ta, and Ru, and more preferably has a metal-containing substance including at least one metal selected from the group consisting of Cu, V, and Co.

More specific examples of the object to be treated include a substrate having a metal wire film, a barrier film, and an insulating film on a surface of a wafer constituting the semiconductor substrate.

Specific examples of the wafer constituting a semiconductor substrate include a wafer consisting of a silicon-based material, such as a silicon (Si) wafer, a silicon carbide (SiC) wafer, and a silicon-including resin-based wafer (glass epoxy wafer), a gallium phosphorus (GaP) wafer, a gallium arsenic (GaAs) wafer, and an indium phosphorus (InP) wafer.

The silicon wafer may be an n-type silicon wafer in which a silicon wafer is doped with a pentavalent atom (for example, phosphorus (P), arsenic (As), and antimony (Sb)), and a p-type silicon wafer in which a silicon wafer is doped with a trivalent atom (for example, boron (B) and gallium (Ga)). The silicon of the silicon wafer may be, for example, amorphous silicon, single crystal silicon, polycrystalline silicon, or polysilicon.

Among those, the cleaning liquid is useful for a wafer consisting of a silicon-based material, such as a silicon wafer, a silicon carbide wafer, and a resin-based wafer including silicon (glass epoxy wafers).

The semiconductor substrate may have an insulating film on the wafer.

Specific examples of the insulating film include a silicon oxide film (for example, a silicon dioxide ($SiO_2$) film, a tetraethyl orthosilicate ($Si(OC_2H_5)_4$) film (TEOS film), a silicon nitride film (for example, silicon nitride ($Si_3N_4$), and silicon nitride carbide (SiNC)), and a low-dielectric-constant (Low-k) film (for example, a carbon-doped silicon oxide (SiOC) film and a silicon carbide (SiC) film).

The insulating film may be composed of a plurality of films. Examples of the insulating film composed of a plurality of films include an insulating film formed by combining a film including silicon oxide and a film including silicon oxycarbide.

Among those, the cleaning liquid is useful as a cleaning liquid for a semiconductor substrate having a low-dielectric-constant (Low-k) film as an insulating film.

Examples of the barrier film include a barrier film including one or more materials selected from the group consisting of tantalum (Ta), tantalum nitride (TaN), titanium nitride (TiN), tungsten nitride (TiW), tungsten (W), and tungsten nitride (WN).

The semiconductor substrate preferably has at least one selected from the group consisting of a film containing copper as a main component (copper-containing film), a film containing cobalt as a main component (Co-containing film), and a film containing tungsten as a main component (W-containing film), and more preferably contains a Co-containing film or a W-containing film.

Examples of the copper-containing film include a wiring line film consisting of only metallic copper (copper wiring line film), and a wiring line film consisting of an alloy of metallic copper and another metal (copper alloy wiring line film).

Specific examples of the copper alloy wiring line film include a wiring line film consisting of an alloy of one or more metals selected from Al, Ti, Cr, Mn, Ta, and W, and copper. More specific examples of the copper alloy wiring line film include a CuAl alloy wiring line film, a CuTi alloy wiring line film, a CuCr alloy wiring line film, a CuMn alloy wiring line film, a CuTa alloy wiring line film, and a CuW alloy wiring line film.

Examples of the Co-containing film include a metal film consisting of only metal cobalt (Co metal film), and a metal film consisting of an alloy composed of metallic cobalt and another metal (Co alloy metal film).

Specific examples of the Co alloy metal film include a metal film consisting of an alloy composed of one or more metals selected from Ti, Cr, Fe, Ni, Mo, Pd, Ta, and W, and cobalt. More specific examples of the Co alloy metal film include a CoTi alloy metal film, a CoCr alloy metal film, a CoFe alloy metal film, a CoNi alloy metal film, a CoMo alloy metal film, a CoPd alloy metal film, a CoTa alloy metal film, and a CoW alloy metal film.

Among the Co-containing films, the Co metal film is often used as the wiring line film, and the Co alloy metal film is often used as the barrier metal.

Examples of the W-containing film include a metal film consisting of only tungsten (W metal film) and a metal film consisting of an alloy made of tungsten and another metal (W alloy metal film).

Specific examples of the W alloy metal film include a WTi alloy metal film and a WCo alloy metal film.

The tungsten-containing film is often used as a barrier metal.

In addition to those mentioned above, the object to be treated may contain various layers and/or structures as desired. For example, the substrate may contain a metal wire, a gate electrode, a source electrode, a drain electrode, an insulating layer, a ferromagnetic layer, and/or a non-magnetic layer.

The substrate may contain exposed integrated circuit structures, for example, interconnect mechanism such as a metal wire and a dielectric material. Examples of the metal and the alloy used in the interconnect mechanism include aluminum, a copper-aluminum alloy, copper, titanium, tantalum, cobalt, silicon, titanium nitride, tantalum nitride, and tungsten. The substrate may contain layers of silicon oxide, silicon nitride, silicon carbide, and/or carbon-doped silicon oxide.

A method for producing the object to be treated is not particularly limited as long as it is a method usually performed in this field.

Examples of a method of forming the insulating film on a wafer constituting a semiconductor substrate include a method in which a wafer constituting a semiconductor substrate is subjected to a heat treatment in the presence of an oxygen gas to form a silicon oxide film, and then a gas of silane and ammonia is introduced thereto to form a silicon nitride film by a chemical vapor deposition (CVD) method.

Examples of a method for forming the metal-containing layer on a wafer constituting a semiconductor substrate include a method in which a circuit is formed on a wafer having an insulating film by a known method such as a resist, and then a metal-containing layer is formed by a method such as plating, a sputtering method, a CVD method, and a molecular beam epitaxy (MBE) method.

The object to be treated, which is an object for the present cleaning method, is a substrate that has been subjected to a CMP treatment after providing an insulating film, a barrier metal, and a metal-containing film on the wafer. The CMP treatment is a treatment of flattening a surface of a substrate having a metal-containing film, a barrier metal, and an insulating film by a combined action of a chemical action using a polishing slurry including polishing fine particles (abrasive grains) and mechanical polishing.

A surface of the semiconductor substrate that has been subjected to the CMP treatment may have impurities remaining thereon, such as abrasive grains (for example, silica and alumina) used in the CMP treatment, a polished metal-containing film, and metal impurities (metal residue) derived from the barrier metal. For example, since these impurities may short-circuit the wiring lines and deteriorate the electrical characteristics of the semiconductor substrate, the semiconductor substrate that has been subjected to the CMP treatment is subjected to a cleaning treatment for removing these impurities from the surface.

Specific examples of the semiconductor substrate that has been subjected to the CMP treatment include the substrate that has been subjected to a CMP treatment, described in Vol. 84, No. 3, 2018, but the present invention is not limited thereto.

A surface of the semiconductor substrate, which is an object to be cleaned using the cleaning liquid, may be subjected to a CMP treatment and then to a buffing treatment.

The buffing treatment is a treatment of reducing impurities on the surface of the semiconductor substrate using a polishing pad. More specifically, the surface of the semiconductor substrate that has been subjected to the CMP treatment is brought into contact with the polishing pad, and the semiconductor substrate and the polishing pad are relatively slid while supplying a composition for a buffing treatment to the contact portion. As a result, impurities on the surface of the semiconductor substrate are removed by a frictional force of the polishing pad and a chemical action of a composition for a buffing treatment.

As the composition for a buffing treatment, a known composition for a buffing treatment can be appropriately used depending on a type of the semiconductor substrate, and a type and an amount of the impurities to be removed. The component included in the composition for a buffing treatment is not particularly limited, and examples thereof include a water-soluble polymer such as a polyvinyl alcohol, water as a dispersion medium, and an acid such as nitric acid.

In addition, in one embodiment of the buffing treatment, it is preferable that a semiconductor substrate is buffed using the cleaning liquid as the composition for a buffing treatment.

A polishing device and polishing conditions used in the buffing treatment can be appropriately selected from known devices and conditions according to a type of the semiconductor substrate and an object to be removed. Examples of the buffing treatment include the treatments described in paragraphs [0085] to [0088] of WO2017/169539A, the contents of which are incorporated herein by reference.

The present cleaning method includes a cleaning step of cleaning the semiconductor substrate by bringing the cleaning liquid into contact with the semiconductor substrate that has been subjected to CMP.

In the present cleaning method, a method of bringing the cleaning liquid into contact with the semiconductor substrate is not particularly limited, and examples thereof include a method in which an object to be treated is immersed in a cleaning liquid charged in a tank, a method in which a cleaning liquid is sprayed onto an object to be treated, a method in which a cleaning liquid is flown onto an object to be treated, and a combination thereof. From the viewpoint of residue removing properties, the method in which the object to be treated is immersed in the cleaning liquid is preferable.

The cleaning step for the semiconductor substrate that has been subjected to a CMP treatment is not particularly limited as long as it is a known method, and cleaning in any of modes usually performed in this field, such as brush scrub cleaning in which a cleaning member such as a brush is physically brought into contact with a surface of the semiconductor substrate while supplying a cleaning liquid to a semiconductor substrate, thereby removing residues; an immersion mode in which a semiconductor substrate is immersed in a cleaning liquid; a spinning (dropping) mode in which a cleaning liquid is dropped while rotating a semiconductor substrate; and a spray mode in which a cleaning liquid is sprayed may be adopted as appropriate.

The "semiconductor substrate that has been subjected to a CMP treatment" to which the present cleaning step is applied is not particularly limited, and examples thereof include the substrate described in [Object to Be Treated] above.

The cleaning step may be performed only once or twice or more. In a case of performing cleaning two or more times, the same method may be repeated or different methods may be combined.

As a method for cleaning the semiconductor substrate, either a single-wafer method or a batch method may be adopted. The single-wafer method is a method of cleaning semiconductor substrates one by one, and the batch method is a method of cleaning a plurality of semiconductor substrates at the same time.

The temperature of the cleaning liquid used for cleaning a semiconductor substrate is not particularly limited as long as it is a temperature usually used in this field. Cleaning is often performed at room temperature (25° C.), but any temperature can be selected for the purpose of improving cleaning properties and/or suppressing a damage to members. For example, the temperature of the cleaning liquid is preferably 10° C. to 60° C., and more preferably 15° C. to 50° C.

The cleaning time in cleaning the semiconductor substrate cannot be unequivocally determined since it depends on types and contents of the components included in the cleaning liquid, but practically, the cleaning time is preferably 10 seconds to 2 minutes, more preferably 20 seconds to 1 minute and 30 seconds, and still more preferably 30 seconds to 1 minute.

The supply amount (supply rate) of the cleaning liquid in the cleaning step for the semiconductor substrate is not particularly limited, but is preferably 50 to 5,000 mL/min, and more preferably 500 to 2,000 mL/min.

In the cleaning of the semiconductor substrate, a mechanical stirring method may be used in order to further improve the cleaning ability of the cleaning liquid.

Examples of the mechanical stirring method include a method of circulating a cleaning liquid on a semiconductor substrate, a method of flowing or spraying a cleaning liquid on a semiconductor substrate, and a method of stirring a cleaning liquid with an ultrasonic or a megasonic.

After cleaning the semiconductor substrate, a step of rinsing and cleaning the semiconductor substrate with a rinsing liquid (hereinafter referred to as a "rinsing step") may be performed.

The rinsing step is preferably a step which is performed continuously subsequently after the cleaning step for the semiconductor substrate, and involves performing rinsing with a rinsing liquid (rinsing solvent) over 5 seconds to 5 minutes. The rinsing step may be performed using the above-mentioned mechanical stirring method.

Examples of the rinsing liquid include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. In addition, an aqueous rinsing liquid having a pH of more than 8 (aqueous ammonium hydroxide that has been diluted, and the like) may be used.

As a method of bringing the rinsing liquid into contact with the semiconductor substrate, the above-mentioned method of bringing the cleaning liquid into contact with the semiconductor substrate can be similarly applied.

In addition, after the rinsing step, a drying step of drying the semiconductor substrate may be performed.

Examples of the drying method include, but not limited to, a spin drying method, examples of the drying method include a spin drying method, a method of flowing a dry gas onto a semiconductor substrate, a method of heating a substrate by a heating means such as a hot plate and an infrared lamp, a Marangoni drying method, a Rotagoni drying method, an isopropyl alcohol (IPA) drying method, and any combinations thereof.

EXAMPLES

Hereinbelow, the present invention will be described in more detail with reference to Examples. The materials, the amounts of the materials to be used, the proportions, and the like shown in the Examples below may be modified as appropriate as long as the modifications do not depart from the spirit of the present invention. Therefore, the scope of the present invention should not be construed as being limited to Examples shown below.

In the following Examples, the pH of the cleaning liquid was measured at 25° C. using a pH meter (manufactured by HORIBA, Ltd., model "F-74") in accordance with JIS Z8802-1984.

Furthermore, in the production of cleaning liquids of Examples and Comparative Examples, all of handling of a container, and production, filling, storage, and analytical measurement of the cleaning liquids were performed in a clean room satisfying a level of ISO Class 2 or lower.

[Raw Materials for Cleaning Liquid]

The following compounds were used to produce a cleaning liquid. Furthermore, as various components used in Examples, those all classified into a semiconductor grade or a high-purity grade equivalent thereto were used.

[Component A]

As the component A, compounds consisting of the following cations (A-1) to (A-4), (A-8), (A-12), (A-21), (A-32), (A-X1), and (A-X2), and a hydroxide ion as a counter ion were used.

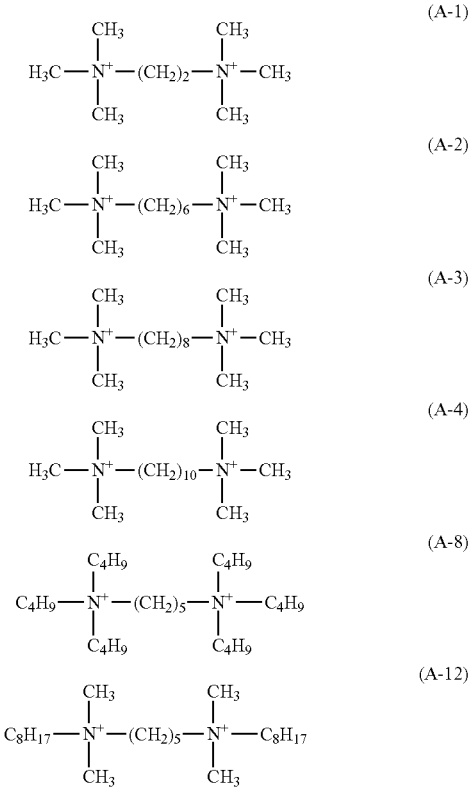

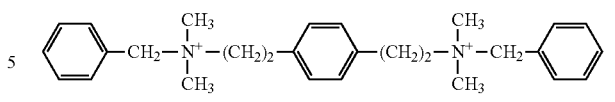

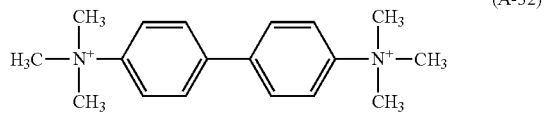

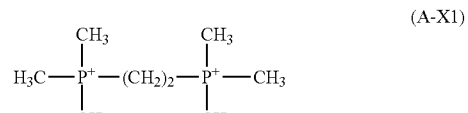

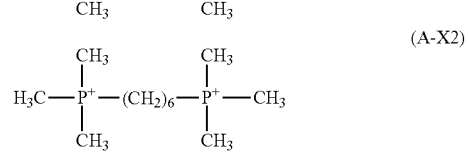

[Organic Acid]
  Citric acid
  1-Hydroxyethylidene-1,1-diphosphonic acid (HEDPO)
  Diethylenetriaminepentaacetic acid (DTPA)
  Adipic acid
  Histidine

[Heteroaromatic Compounds]
  BTA: Benzotriazole
  3-APy: 3-Aminopyrazole
  5-Ate: 5-Aminotetrazole
  BTA D1: 2,2'-{[(5-Methyl-1H-benzotriazol-1-yl)methyl]imino}diethanol

[Oxidizing Agent]
  Periodic acid

[Surfactant]
  W-2: Polyoxyethylene lauryl ether phosphoric acid ester ($C_{12}H_{25}(EO)_3PO_3H_2$)
  W-3: Polyoxyethylenedimethylphenyl ether phosphate ($(CH_3)_2Ph(EO)_6PO_3H_2$)

[Amino Alcohol]
  MEA: Monoethanolamine
  AMP: 2-Amino-2-methyl-1-propanol

[Other Additives]
  γ-CD: γ-Cyclodextrin (corresponding to an anticorrosive agent (clathrate compound))
  Chlorhexidine gluconate (CH): manufactured by Fujifilm Wako Pure Chemical Corporation (corresponding to a specific chelating agent)
  PAA: Polyacrylic acid (weight-average molecular weight (Mw): 6,000, manufactured by Toagosei Co., Ltd., trade name "Aron A-10SL", corresponding to anticorrosive agent (polymer compound))

In addition, in a step of producing each cleaning liquid in the present Example, either sulfuric acid ($H_2SO_4$) or diazabicycloundecene (DBU) was used as a pH adjuster. It should be noted that in Comparative Example 1, tetramethylammonium hydroxide (TMAH) was used, and in Comparative Example 3, either of sulfuric acid ($H_2SO_4$) and ammonia ($NH_3$) was used, as the pH adjuster.

In addition, commercially available ultrapure water (manufactured by FUJIFILM Wako Pure Chemical Corporation) was used as water.

Examples 1 to 55 and Comparative Examples 1 to 3

[Preparation of Cleaning Liquid]

The cleaning liquids of Examples 1 to 55 and Comparative Examples 1 to 3 were prepared.

A method for preparing the cleaning liquid will be described by taking Example 1 as an example.

Each of raw materials (or an aqueous solution thereof) of the compound (A-1), citric acid, histidine, and monoethanolamine (MEA) was filtered through a high-density polyethylene filter having a pore diameter of 0.02 μm. After adding the raw materials and ultrapure water in amounts having the contents shown in Table 1, a pH adjuster was added to the mixture so that the pH of the prepared cleaning liquid was 10.0. The obtained mixed solution was sufficiently stirred with a stirrer to obtain a concentrated cleaning liquid of Example 1.

According to the method for preparing the concentrated cleaning liquid of Example 1, concentrated cleaning liquids of Examples 1 to 55 and Comparative Examples 1 to 3 having the compositions shown in Table 1 were each produced.

The "Amount" column in Table 1 shows the content (unit: % by mass) of each component with respect to the total mass of the concentrated cleaning liquid. Furthermore, the content of each component in the table indicates a content of each component as a compound.

The numerical value in the "Ratio A" column indicates a mass ratio of the content of the surfactant to the content of the component A (the content of the surfactant/the content of the component A).

The numerical value in the "Ratio B" column indicates a mass ratio of the content of the amino alcohol to the content of the component A (the content of the amino alcohol/the content of the component A).

The numerical value in the "pH of Concentrated cleaning liquid" column indicates a pH of the concentrated cleaning liquid at 25° C. measured by a pH meter.

The "Balance" in the "Water" column indicates that in the concentrated cleaning liquids of each Example and each Comparative Example, the components shown in the tables, and as desired, the components other than the pH adjuster added in such an amount that the pit of the concentrated cleaning liquid is a numerical value in the "pH of Concentrated cleaning liquid" column are water.

[Evaluation Test for Cleaning Liquid]

A cleaning liquid for an evaluation test was prepared from the obtained concentrated cleaning liquid. More specifically, 2 mL of each concentrated cleaning liquid of Examples and Comparative Examples was separated and diluted 100-fold by volume with ultrapure water to prepare a sample (200 mL) of the cleaning liquid for the evaluation test.

The content of water contained in each of the prepared samples of the cleaning liquids of Examples was 99.8% by mass or more with respect to the total mass of the cleaning liquid.

In addition, the pH of each of the cleaning liquid sample of each example was in the range of 7.0 to 11.8 at 25° C. On the other hand, the cleaning liquid sample of Comparative Example 2 had a pH of more than 11.8 at 25° C., and the cleaning liquid sample of Comparative Example 3 had a pH of 6.7 or less at 25° C.

<Evaluation of Corrosion Prevention Performance>

A wafer (12 inches in diameter) having a metal film consisting of tungsten or cobalt on the surface was cut to prepare each of 2 cm☐wafer coupons. The thickness of each metal film was 20 nm. The wafer coupon was immersed in a sample (temperature: 23° C.) of each cleaning liquid produced by the method, and an immersion treatment was performed for 30 minutes at a stirring rotation speed of 250 rpm. For each metal film, a corrosion rate per unit time (unit: Å/min) was calculated from a difference in the thickness of each metal film measured before and after the immersion treatment. From the obtained corrosion rate, the corrosion prevention performance of the cleaning liquid was evaluated based on the following evaluation standard.

Furthermore, the lower the corrosion rate, the better the corrosion prevention performance of the cleaning liquid.

AA: The corrosion rate is 0.3 Å/min or less

A: The corrosion rate is more than 0.3 Å/min and is less than 0.5 Å/min

B: The corrosion rate is more than 0.5 Å/min and less than 1.0 Å/min

C: The corrosion rate is 1.0 Amin or more and less than 3.0 Å/min

D: The corrosion rate is 3.0 Å/min or more

<Evaluation of Particle Cleaning Performance>

The particle cleaning performance in a case where a metal film subjected to chemical mechanical polishing was washed using the cleaning liquid produced by the method was evaluated.

A wafer (diameter of 12 inches) having a metal film consisting of cobalt on the surface was polished using FREX300S-II (polishing device, manufactured by Ebara Corporation). As the polishing liquid at this time, BSL8180C (trade name, manufactured by Fujifilm Planar Solutions Co., Ltd.) was used in Examples 1 to 54 and Comparative Examples 1 to 3, and a polishing liquid 1A prepared by the following method was used in Example 55. In addition, the polishing pressure was 2.0 psi, and the supply rate of the polishing liquid was 0.28 mL/(min·cm$^2$). The polishing time was 60 seconds.

Then, the polished wafer was scrub-washed for 60 minutes, using a sample of each cleaning liquid which had been prepared by the method described in the evaluation test of the corrosion prevention performance, and adjusted to room temperature (23° C.); and then dried.

(Polishing Liquid 1A)

The composition of the polishing liquid 1A used in Example 55 is shown below.

The compound (A-1): 0.50% by mass

Colloidal silica ("PL1" manufactured by Fuso Chemical Co., Ltd., average primary particle diameter of 10 nm, aspect ratio of 1.8, degree of association of 2): 1.5% by mass Citric acid: 0.05% by mass Benzotetrazole (BTA): 0.0001% by mass Hydrogen peroxide: 0.01% by mass pH Adjuster (sulfate or DBU): Appropriate amount Water: Balance The polishing liquid 1A was prepared by the following method. The respective raw materials (or aqueous solutions thereof) were subjected to a filtration treatment through a high-density polyethylene filter. At this time, an aqueous solution of colloidal silica was filtered through a filter having a pore diameter of 0.1 μm, and the other raw materials (or aqueous solutions thereof) were filtered through a filter having a pore diameter of 0.02 μm. Next, after adding each of the raw materials that had been subjected to a filtration treatment and ultrapure water in amounts having the contents, a pH adjuster was added so that the pH of the prepared polishing liquid was 10.0. The obtained mixed solution was sufficiently stirred with a stirrer to obtain a polishing liquid 1A.

A defect detection device (ComPlus-II, manufactured by AMAT) was used to detect defects on the polished surface of the obtained wafer. The detected defects were observed using a scanning electron microscope (SEM), the defects were classified and the number of particle-derived defects (particle defects) was measured. From the obtained number of particle defects, the particle cleaning performance of the cleaning liquid was evaluated based on the following evaluation standard.

It can be evaluated that the smaller the number of particle defects detected on the polished surface of the wafer, the better the particle cleaning performance.

A: The number of particle defects per wafer is 10 or less
B: The number of particle defects per wafer is more than 10 and 20 or less
C: The number of particle defects per wafer is more than 20 and 50 or less
D: The number of particle defects per wafer is more than 50

TABLE 1

| | Composition of etchant | | | | | | | Evaluation | |
|---|---|---|---|---|---|---|---|---|---|
| | Ratio A | Amino alcohol Type | Amount | Ratio B | pH adjuster | Water | pH of etchant | Corrosion prevention performance | Residue removal performance |
| Example 1B | | | | | $H_2SO_4$/DBU | Balance | 10.0 | B | A |
| Example 2B | | | | | $H_2SO_4$/DBU | Balance | 10.0 | B | A |
| Example 3B | | | | | $H_2SO_4$/DBU | Balance | 10.0 | B | A |
| Example 4B | | | | | $H_2SO_4$/DBU | Balance | 10.0 | B | A |
| Example 5B | | | | | $H_2SO_4$/DBU | Balance | 10.0 | B | A |
| Example 6B | | | | | $H_2SO_4$/DBU | Balance | 10.0 | B | B |
| Example 7B | | | | | $H_2SO_4$/DBU | Balance | 10.0 | A | A |
| Example 8B | | | | | $H_2SO_4$/DBU | Balance | 10.0 | C | B |
| Example 9B | | | | | $H_2SO_4$/DBU | Balance | 10.0 | C | B |
| Example 10B | | | | | $H_2SO_4$/DBU | Balance | 10.0 | C | B |
| Example 11B | | | | | $H_2SO_4$/DBU | Balance | 7.0 | B | B |
| Example 12B | | | | | $H_2SO_4$/DBU | Balance | 8.0 | A | A |
| Example 13B | | | | | $H_2SO_4$/DBU | Balance | 9.0 | A | A |
| Example 14B | | | | | $H_2SO_4$/DBU | Balance | 11.0 | A | A |
| Example 15B | | | | | $H_2SO_4$/DBU | Balance | 12.0 | B | B |
| Example 16B | | | | | $H_2SO_4$/DBU | Balance | 13.5 | C | B |
| Example 17B | | | | | $H_2SO_4$/DBU | Balance | 10.0 | C | A |
| Example 18B | | | | | $H_2SO_4$/DBU | Balance | 10.0 | B | A |
| Example 19B | | | | | $H_2SO_4$/DBU | Balance | 10.0 | B | A |
| Example 20B | | | | | $H_2SO_4$/DBU | Balance | 10.0 | A | A |
| Example 21B | | | | | $H_2SO_4$/DBU | Balance | 10.0 | A | A |
| Example 22B | | | | | $H_2SO_4$/DBU | Balance | 10.0 | A | A |
| Example 23B | | | | | $H_2SO_4$/DBU | Balance | 10.0 | A | B |
| Example 24B | | | | | $H_2SO_4$/DBU | Balance | 10.0 | A | C |
| Example 25B | 1,250 | | | | $H_2SO_4$/DBU | Balance | 10.0 | B | A |
| Example 26B | 625 | | | | $H_2SO_4$/DBU | Balance | 10.0 | B | A |
| Example 27B | 250 | | | | $H_2SO_4$/DBU | Balance | 10.0 | B | A |
| Example 28B | 83 | | | | $H_2SO_4$/DBU | Balance | 10.0 | A | A |
| Example 29B | 17 | | | | $H_2SO_4$/DBU | Balance | 10.0 | A | A |
| Example 30B | 5 | | | | $H_2SO_4$/DBU | Balance | 10.0 | B | A |
| Example 31B | 0.5 | | | | $H_2SO_4$/DBU | Balance | 10.0 | B | B |
| Example 32B | | TEA | 0.10% | 5.00 | $H_2SO_4$/DBU | Balance | 10.0 | B | A |
| Example 33B | | TEA | 0.50% | 1.00 | $H_2SO_4$/DBU | Balance | 10.0 | B | A |
| Example 34B | | TEA | 1.00% | 0.50 | $H_2SO_4$/DBU | Balance | 10.0 | A | A |
| Example 35B | | TEA | 3.00% | 0.17 | $H_2SO_4$/DBU | Balance | 10.0 | A | A |
| Example 36B | | TEA | 5.00% | 0.10 | $H_2SO_4$/DBU | Balance | 10.0 | B | A |
| Example 37B | | TEA | 10.00% | 0.05 | $H_2SO_4$/DBU | Balance | 10.0 | B | B |
| Comparative Example 1B | | | | | TMAH | Balance | 10.0 | D | C |
| Comparative Example 2B | | | | | $H_2SO_4$/DBU | Balance | 14.0 | D | C |
| Comparative Example 3B | | | | | $H_2SO_4$/$NH_3$ | Balance | 5.5 | D | D |

TABLE 2

| | | Composition of concentrated cleaning liquid | | | | | pH of concentrated cleaning liquid | Evaluation | | |
|---|---|---|---|---|---|---|---|---|---|---|
| | | Amino alcohol | | | | | | Corrosion prevention performance | | Particle cleaning performance |
| | Ratio A | Type | Amount | Ratio B | pH adjuster | Water | | W | Co | |
| Example 1 | | MEA | 2.50% | 0.20 | H$_2$SO$_4$/DBU | Balance | 10.0 | B | A | A |
| Example 2 | | MEA | 2.50% | 0.20 | H$_2$SO$_4$/DBU | Balance | 10.0 | B | A | B |
| Example 3 | | MEA | 2.50% | 0.20 | H$_2$SO$_4$/DBU | Balance | 10.0 | B | A | B |
| Example 4 | | MEA | 2.50% | 0.20 | H$_2$SO$_4$/DBU | Balance | 10.0 | B | A | B |
| Example 5 | | MEA | 2.50% | 0.20 | H$_2$SO$_4$/DBU | Balance | 10.0 | B | A | B |
| Example 6 | | MEA | 2.50% | 0.20 | H$_2$SO$_4$/DBU | Balance | 10.0 | B | A | B |
| Example 7 | | MEA | 2.50% | 0.20 | H$_2$SO$_4$/DBU | Balance | 10.0 | A | A | A |
| Example 8 | | MEA | 2.50% | 0.20 | H$_2$SO$_4$/DBU | Balance | 10.0 | C | B | B |
| Example 9 | | MEA | 2.50% | 0.20 | H$_2$SO$_4$/DBU | Balance | 10.0 | C | B | B |
| Example 10 | | MEA | 2.50% | 0.20 | H$_2$SO$_4$/DBU | Balance | 10.0 | C | B | B |
| Example 11 | | MEA | 2.50% | 0.20 | H$_2$SO$_4$/DBU | Balance | 7.0 | B | B | B |
| Example 12 | | MEA | 2.50% | 0.20 | H$_2$SO$_4$/DBU | Balance | 8.0 | B | A | B |
| Example 13 | | MEA | 2.50% | 0.20 | H$_2$SO$_4$/DBU | Balance | 9.0 | B | A | B |
| Example 14 | | MEA | 2.50% | 0.20 | H$_2$SO$_4$/DBU | Balance | 11.0 | B | A | B |
| Example 15 | | MEA | 2.50% | 0.20 | H$_2$SO$_4$/DBU | Balance | 12.0 | B | A | B |
| Example 16 | | MEA | 2.50% | 0.20 | H$_2$SO$_4$/DBU | Balance | 13.5 | B | B | B |
| Example 17 | | MEA | 2.50% | 0.002 | H$_2$SO$_4$/DBU | Balance | 10.0 | C | A | C |
| Example 18 | | MEA | 2.50% | 0.01 | H$_2$SO$_4$/DBU | Balance | 10.0 | B | A | C |
| Example 19 | | MEA | 2.50% | 0.04 | H$_2$SO$_4$/DBU | Balance | 10.0 | B | A | B |
| Example 20 | | MEA | 2.50% | 0.40 | H$_2$SO$_4$/DBU | Balance | 10.0 | A | A | A |
| Example 21 | | MEA | 2.50% | 1.20 | H$_2$SO$_4$/DBU | Balance | 10.0 | A | A | A |
| Example 22 | | MEA | 2.50% | 2.00 | H$_2$SO$_4$/DBU | Balance | 10.0 | A | A | A |
| Example 23 | | MEA | 2.50% | 3.20 | H$_2$SO$_4$/DBU | Balance | 10.0 | A | B | B |
| Example 24 | | MEA | 2.50% | 4.80 | H$_2$SO$_4$/DBU | Balance | 10.0 | A | C | C |
| Example 25 | 7,500 | MEA | 2.50% | 1.20 | H$_2$SO$_4$/DBU | Balance | 10.0 | B | A | A |
| Example 26 | 3,750 | MEA | 2.50% | 1.20 | H$_2$SO$_4$/DBU | Balance | 10.0 | B | A | A |
| Example 27 | 1,500 | MEA | 2.50% | 1.20 | H$_2$SO$_4$/DBU | Balance | 10.0 | B | A | A |
| Example 28 | 500 | MEA | 2.50% | 1.20 | H$_2$SO$_4$/DBU | Balance | 10.0 | A | A | A |
| Example 29 | 100 | MEA | 2.50% | 1.20 | H$_2$SO$_4$/DBU | Balance | 10.0 | AA | A | A |
| Example 30 | 30 | MEA | 2.50% | 1.20 | H$_2$SO$_4$/DBU | Balance | 10.0 | AA | A | A |
| Example 31 | 3 | MEA | 2.50% | 1.20 | H$_2$SO$_4$/DBU | Balance | 10.0 | AA | A | A |
| Example 32 | | MEA | 0.10% | 5.00 | H$_2$SO$_4$/DBU | Balance | 10.0 | C | C | C |
| Example 33 | | MEA | 0.50% | 1.00 | H$_2$SO$_4$/DBU | Balance | 10.0 | C | B | B |
| Example 34 | | MEA | 1.00% | 0.50 | H$_2$SO$_4$/DBU | Balance | 10.0 | B | B | B |
| Example 35 | | MEA | 3.00% | 0.17 | H$_2$SO$_4$/DBU | Balance | 10.0 | B | B | B |

TABLE 3

| | Composition of concentrated cleaning liquid | | | | | | | | |
|---|---|---|---|---|---|---|---|---|---|
| | Component A | | Organic acid | | | | Additive | | Surfactant |
| | Type | Amount | Type | Amount | Type | Amount | Type | Amount | Type | Amount |
| Example 36 | A-4 | 0.50% | Citric acid | 1.50% | Histidine | 0.25% | | | | |
| Example 37 | A-4 | 0.50% | Citric acid | 1.50% | Histidine | 0.25% | | | | |
| Example 38 | A-2 | 0.50% | Citric acid | 3.00% | Histidine | 0.25% | γ-CD | 0.20% | W-2 | 1.00% |
| | | | DTPA | 0.10% | | | | | | |
| Example 39 | A-2 | 0.25% | Citric acid | 3.00% | Histidine | 0.25% | γ-CD | 0.20% | W-2 | 1.00% |
| | A-8 | 0.25% | DTPA | 0.10% | | | | | | |
| Example 40 | A-2 | 0.05% | Citric acid | 3.00% | Histidine | 0.25% | γ-CD | 0.20% | W-2 | 1.00% |
| | A-8 | 0.45% | DTPA | 0.10% | | | | | | |
| Example 41 | A-2 | 0.45% | Citric acid | 3.00% | Histidine | 0.25% | γ-CD | 0.20% | W-2 | 1.00% |
| | A-8 | 0.05% | DTPA | 0.10% | | | | | | |
| Example 42 | A-2 | 0.50% | HEDPO | 0.12% | Histidine | 0.25% | γ-CD | 0.20% | W-2 | 1.00% |
| | | | DTPA | 0.10% | | | | | | |
| Example 43 | A-2 | 0.50% | HEDPO | 0.12% | Histidine | 0.25% | γ-CD | 0.20% | W-3 | 1.00% |
| | | | DTPA | 0.10% | | | | | | |
| Example 44 | A-2 | 0.50% | HEDPO | 0.12% | Histidine | 0.25% | γ-CD | 0.20% | | |
| | | | DTPA | 0.10% | | | CHG | 0.20% | | |
| Example 45 | A-2 | 0.50% | HEDPO | 0.12% | Histidine | 0.25% | PAA | 0.20% | | |
| | | | DTPA | 0.10% | | | | | | |
| Example 46 | A-2 | 0.50% | HEDPO | 0.12% | Histidine | 0.25% | γ-CD | 0.05% | W-3 | 1.00% |
| | | | DTPA | 0.10% | | | CHG | 0.20% | | |
| Example 47 | A-2 | 0.50% | Citric acid | 1.50% | | | 3-APy | 0.25% | | |
| | | | | | | | γ-CD | 0.20% | | |

TABLE 3-continued

| | Composition of concentrated cleaning liquid | | | | | | | | |
|---|---|---|---|---|---|---|---|---|---|
| | Component A | | Organic acid | | | | Additive | | Surfactant |
| | Type | Amount | Type | Amount | Type | Amount | Type | Amount | Type | Amount |
| Example 48 | A-2 | 0.50% | Citric acid | 1.50% | | | 5-ATe | 0.25% | | |
| | | | | | | | γ-CD | 0.20% | | |
| Example 49 | A-2 | 0.50% | Ciuic sold | 1.50% | | | BTA D1 | 0.25% | | |
| | | | | | | | γ-CD | 0.20% | | |
| Example 50 | A-2 | 0.50% | Citric acid | 1.50% | | | Periodic acid | 0.20% | | |
| Example 51 | A-2 | 0.50% | Citric acid | 1.50% | | | BTA D1 | 0.25% | | |
| | | | DTPA | 0.20% | | | γ-CD | 0.20% | | |
| Example 52 | A-2 | 0.50% | HEDPO | 1.50% | | | BTA D1 | 0.25% | | |
| | | | DTPA | 0.20% | | | γ-CD | 0.20% | | |
| Example 53 | A-2 | 0.50% | HEDPO | 1.50% | | | BTA D1 | 0.25% | | |
| | | | DTPA | 0.20% | | | γ-CD | 0.20% | | |
| Example 54 | A-2 | 0.50% | Citric acid | 1.50% | | | BTA D1 | 0.25% | | |
| | | | Adipic acid | 0.20% | | | γ-CD | 0.20% | | |
| Example 55 | A-4 | 0.50% | Citric acid | 1.50% | Histidine | 0.25% | | | | |
| Comparative Example 1 | — | — | HEDPO | 0.12% | | | BTA | 0.0001% | | |
| | | | DTPA | 0.10% | | | | | | |
| Comparative Example 2 | A-8 | 0.50% | HEDPO | 0.12% | | | BTA | 0.0001% | | |
| | | | DTPA | 0.10% | | | | | | |
| Comparative Example 3 | A-8 | 0.50% | HEDPO | 0.12% | | | BTA | 0.0001% | | |
| | | | DTPA | 0.10% | | | | | | |

TABLE 4

| | Composition of concentrated cleaning liquid | | | | | | pH of concentrated cleaning liquid | Evaluation | | |
|---|---|---|---|---|---|---|---|---|---|---|
| | | Amino alcohol | | | | | | Corrosion prevention performance | | Particle cleaning performance |
| | Ratio A | Type | Amount | Ratio B | pH adjuster | Water | | W | Co | |
| Example 36 | | MEA | 5.00% | 0.10 | $H_2SO_4$/DBU | Balance | 10.0 | C | B | B |
| Example 37 | | MEA | 10.00% | 0.05 | $H_2SO_4$/DBU | Balance | 10.0 | C | C | C |
| Example 38 | 0.5 | AMP | 4.50% | 0.11 | $H_2SO_4$/DBU | Balance | 11.0 | B | A | A |
| Example 39 | 0.5 | AMP | 4.50% | 0.11 | $H_2SO_4$/DBU | Balance | 11.0 | B | A | A |
| Example 40 | 0.5 | AMP | 4.50% | 0.11 | $H_2SO_4$/DBU | Balance | 11.0 | B | A | A |
| Example 41 | 0.5 | AMP | 4.50% | 0.11 | $H_2SO_4$/DBU | Balance | 11.0 | B | A | A |
| Example 42 | 0.5 | AMP | 3.00% | 0.17 | $H_2SO_4$/DBU | Balance | 11.0 | B | A | A |
| Example 43 | 0.5 | AMP | 3.00% | 0.17 | $H_2SO_4$/DBU | Balance | 11.0 | B | A | A |
| Example 44 | | AMP | 3.00% | 0.17 | $H_2SO_4$/DBU | Balance | 11.0 | A | A | A |
| Example 45 | | AMP | 3.00% | 0.17 | $H_2SO_4$/DBU | Balance | 11.0 | B | A | A |
| Example 46 | 0.5 | AMP | 3.00% | 0.17 | $H_2SO_4$/DBU | Balance | 11.0 | A | A | A |
| Example 47 | | AMP | 3.00% | 0.17 | $H_2SO_4$/DBU | Balance | 11.0 | B | A | A |
| Example 48 | | AMP | 3.00% | 0.17 | $H_2SO_4$/DBU | Balance | 11.0 | B | A | A |
| Example 49 | | AMP | 3.00% | 0.17 | $H_2SO_4$/DBU | Balance | 11.0 | B | A | A |
| Example 50 | | AMP | 3.00% | 0.17 | $H_2SO_4$/DBU | Balance | 11.0 | C | B | A |
| Example 51 | | AMP | 3.00% | 0.17 | $H_2SO_4$/DBU | Balance | 11.0 | A | A | A |
| Example 52 | | AMP | 0.40% | 1.25 | $H_2SO_4$/DBU | Balance | 9.0 | A | A | A |
| Example 53 | | AMP | 3.00% | 0.17 | $H_2SO_4$/DBU | Balance | 11.5 | A | A | A |
| Example 54 | | AMP | 3.00% | 0.17 | $H_2SO_4$/DBU | Balance | 11.0 | A | A | A |
| Example 55 | | MEA | 10.00% | 0.05 | $H_2SO_4$/DBU | Balance | 10.0 | A | A | A |
| Comparative Example 1 | | MEA | 2.50% | — | TMAH | Balance | 10.0 | D | D | C |
| Comparative Example 2 | | MEA | 2.50% | 0.20 | $H_2SO_4$/DBU | Balance | 14.0 | D | D | C |
| Comparative Example 3 | | MEA | 2.50% | 0.20 | $H_2SO_4$/NH_3 | Balance | 5.5 | D | D | D |

From the results shown in the tables, it was confirmed that desired results could be obtained by using the cleaning liquid of the embodiment of the present invention.

By comparison of Examples 1 to 10, it was confirmed that in a case where the cleaning liquid includes a compound having the cation (A-1) to (A-4), (A-8), (A-X1), or (A-X2) as the component A, the corrosion prevention performance on the W-containing film is more excellent; in a case where the polishing liquid includes compounds having the cations (A-1) to (A-3), (A-8), (A-X1), or (A-X2), the corrosion prevention performance for the Co-containing film is more excellent; and in a case where the polishing liquid includes compound having the cation (A-1) or (A-8), the corrosion prevention performance for the W-containing film is more excellent.

By comparison of Examples 11 to 16, it was confirmed that in a case where the pH of the cleaning liquid was 8.0 to 12.5 at 25° C., the corrosion prevention performance with respect to the Co-containing film was more excellent.

By comparison of Examples 2 and 17 to 20, it was confirmed that in a case where the content of the component A is 0.0001% by mass or more with respect to the total mass of the cleaning liquid, the corrosion prevention performance and the particle cleaning performance with respect to the W-containing film are more excellent; and in a case where the content of the component A is 0.008% by mass or more with respect to the total mass of the cleaning liquid, the corrosion prevention performance and the particle cleaning performance with respect to the W-containing film are more excellent.

In addition, by comparison of Examples 2 and 17 to 20, it was confirmed that in a case where the content of the component A is 0.3% by mass or more with respect to the total solid content of the cleaning liquid, the corrosion prevention performance and the particle cleaning performance with respect to the W-containing film are more excellent; and in a case where the content of the component A is 2% by mass or more with respect to the total solid content of the cleaning liquid, the corrosion prevention performance and the particle cleaning performance with respect to the W-containing film are more excellent.

By comparison of Examples 22 to 24, it was confirmed that in a case where the content of the component A is 0.1% by mass or less with respect to the total mass of the cleaning liquid, the corrosion prevention performance and the particle cleaning performance with respect to the Co-containing film are more excellent; and in a case where the content of the component A is 0.05% by mass or less with respect to the total mass of the cleaning liquid, the corrosion prevention performance and the particle cleaning performance with respect to the Co-containing film are more excellent.

In addition, by comparison of Examples 22 to 24, it was confirmed that in a case where the content of the component A is 70% by mass or less with respect to the total solid content of the cleaning liquid, the corrosion prevention performance and the particle cleaning performance with respect to the Co-containing film are more excellent; and in a case where the content of the component A is 60% by mass or less with respect to the total solid content of the cleaning liquid, the corrosion prevention performance and the particle cleaning performance with respect to the Co-containing film are more excellent.

By comparison of Examples 25 to 31, in a case where the cleaning liquid includes a surfactant, it was confirmed that in a case where the content of the surfactant is 0.000005% by mass or more with respect to the total mass of the cleaning liquid, the corrosion prevention performance for the W-containing film is more excellent; and in a case where the content of the surfactant is 0.00005% by mass or more with respect to the total mass of the cleaning liquid, the corrosion prevention performance for the W-containing film is more excellent.

Moreover, by comparison of Examples 25 to 31, in a case where the cleaning liquid includes a surfactant, it was confirmed that in a case where the ratio A is 1,000 or less, the corrosion prevention performance for the W-containing film is more excellent; and in a case where the ratio A is 300 or less, the corrosion prevention performance for the W-containing film is more excellent.

In addition, by comparison of Examples 25 to 31, in a case where the cleaning liquid includes a surfactant, it was confirmed that in a case where the content of the surfactant is 0.01% by mass or more with respect to the total solid content of the cleaning liquid, the corrosion prevention performance for the W-containing film is more excellent; and in a case where the content of the surfactant is 0.05% by mass or more with respect to the total solid content of the cleaning liquid, the corrosion prevention performance for the W-containing film is more excellent.

By comparison of Examples 32 to 37, in a case where the cleaning liquid includes an amino alcohol, it was confirmed that in a case where the content of the amino alcohol is 0,003% to 0.08% by mass with respect to the total mass of the cleaning liquid, the corrosion prevention performance and the particle cleaning performance with respect to the Co-containing film are more excellent; and in a case where the content of the amino alcohol is 0.008% to 0.04% by mass with respect to the total mass of the cleaning liquid, the corrosion prevention performance with respect to the W-containing film was more excellent.

Moreover, by comparison of Examples 32 to 37, in a case where the cleaning liquid includes an amino alcohol, it was confirmed that in a case where the ratio B is 0.08 to 3, the corrosion prevention performance and the particle cleaning performance with respect to the Co-containing film are more excellent; and in a case where the ratio B is 0.12 to 0.8, the corrosion prevention performance for the W-containing film is more excellent.

In addition, by comparison of Examples 32 to 37, in a case where the cleaning liquid includes an amino alcohol, it was confirmed that in a case where the content of the amino alcohol is 10% to 70% by mass with respect to the total solid content of the cleaning liquid, the corrosion prevention performance and the particle cleaning performance with respect to the Co-containing film are more excellent; and in a case where the content of the amino alcohol is 25% to 60% by mass with respect to the total solid content of the cleaning liquid, the corrosion prevention performance with respect to the W-containing film was more excellent.

In the evaluation test for the cleaning liquid, a wafer having a metal film consisting of copper or cobalt on the surface was subjected to a CMP treatment, and then the surface of the polished wafer was subjected to a buffing treatment. In the buffing treatment, a sample of each cleaning liquid adjusted to room temperature (23° C.) was used as a composition for a buffing treatment. In addition, a buffing treatment was performed under the conditions of a polishing pressure of 2.0 psi, a supply rate of the composition for a buffing treatment: 0.28 mL/(min·cm$^2$), and a polishing time of 60 seconds, using the polishing device used in the CMP treatment.

Then, the wafer that had been subjected to a buffing treatment was washed over 30 seconds using a sample of each cleaning liquid adjusted to room temperature (23° C.), and then subjected to a drying treatment.

The corrosion prevention performance and the particle cleaning performance of the cleaning liquid were evaluated on a polished surface of the obtained wafer according to the evaluation test method, and it was thus confirmed that the same evaluation results as those of the cleaning liquid of each of Examples above were obtained.

What is claimed is:

1. A cleaning liquid for a semiconductor substrate that has been subjected to a chemical mechanical polishing treatment, the cleaning liquid comprising:
   a component A having two or more onium structures in a molecule; and
   water,
   wherein the cleaning liquid has a pH of 7.0 to 11.8 at 25° C., and the component A is at least one selected from the group consisting of a compound represented by General Formula (I), a compound represented by General Formula (II), and a compound having two or more sulfonium structures,

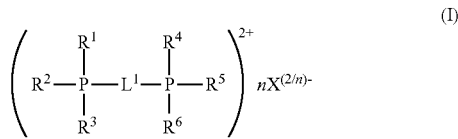

in General Formula (I), $R^1$ to $R^6$ each independently represent a monovalent organic group, two of $R^1$ to $R^6$ may be bonded to each other, $L^1$ represents a divalent linking group which is an aromatic hydrocarbon group, or a group formed by combination of an aliphatic hydrocarbon group and an aromatic hydrocarbon group, the divalent linking group optionally has —S—, —S(=O)$_2$—, —O—, —C(=O)—, or a group formed by a combination of two or more of these groups, instead of a methylene group comprised in the aliphatic hydrocarbon group, n represents 1 or 2, and $X^{(2/n)-}$ represents a (2/n)-valent counterion,

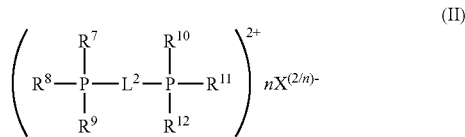

in General Formula (II), $R^7$ to $R^{12}$ each independently represent a monovalent organic group, two of $R^7$ to $R^{12}$ may be bonded to each other, $L^2$ represents a divalent linking group which is an aromatic hydrocarbon group, or a group formed by combination of an aliphatic hydrocarbon group and an aromatic hydrocarbon group, the divalent linking group optionally has —S—, —S(=O)$_2$—, —O—, —C(=O)—, or a group formed by a combination of two or more of these groups, instead of a methylene group comprised in the aliphatic hydrocarbon group, n represents 1 or 2, and $X^{(2/n)-}$ represents a (2/n)-valent counterion.

2. The cleaning liquid according to claim 1,
wherein the component A is the compound represented by General Formula (I) or the compound represented by General Formula (II)

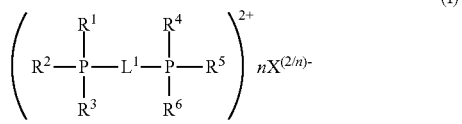

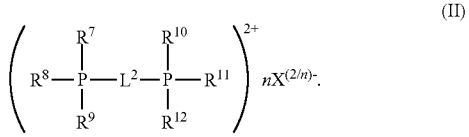

3. The cleaning liquid according to claim 2,
wherein in General Formulae (I) and (II), n represents 2 and $X^{(2/n)-}$ represents a hydroxide ion.

4. The cleaning liquid according to claim 2,
wherein the component A is the compound represented by General Formula (I).

5. The cleaning liquid according to claim 1,
wherein a content of the component A is 2% to 60% by mass with respect to a total mass of the components excluding a solvent in the cleaning liquid.

6. The cleaning liquid according claim 1, further comprising an organic acid or an organic alkali.

7. The cleaning liquid according to claim 1, further comprising an anticorrosive agent.

8. The cleaning liquid according to claim 7,
wherein the anticorrosive agent comprises a heteroaromatic compound.

9. The cleaning liquid according to claim 8,
wherein the heteroaromatic compound is at least one selected from the group consisting of a tetrazole compound, a triazole compound, an imidazole compound, and a pyrazole compound.

10. The cleaning liquid according to claim 1, further comprising a surfactant.

11. The cleaning liquid according to claim 1,
wherein the semiconductor substrate has a metal-containing substance comprising at least one selected from the group consisting of copper, tungsten, and cobalt.

12. A method for cleaning a semiconductor substrate, comprising a cleaning step of cleaning a semiconductor substrate that has been subjected to a chemical mechanical polishing treatment by contacting the substrate with the cleaning liquid according to claim 1.

13. The cleaning liquid according to claim 3,
wherein the component A is the compound represented by General Formula (I).

14. The cleaning liquid according to claim 1,
wherein the aliphatic hydrocarbon group is an alkylene group, an alkenylene group, or a cycloalkylene group.

15. The cleaning liquid according to claim 1,
wherein the divalent linking group represented by $L^1$ has 6 to 20 carbon atoms, and the divalent linking group represented by $L^2$ has 6 to 20 carbon atoms.

16. The cleaning liquid according to claim 14,
wherein the alkylene group is an ethylene group or a pentylene group,
the alkenylene group is a propynylene group,
the cycloalkylene group is a cyclohexylene group, and
the aromatic hydrocarbon group is a phenylene group.

17. The cleaning liquid according to claim 1,
wherein $L^1$ represents a divalent linking group formed by combination of an aliphatic hydrocarbon group and an aromatic hydrocarbon group, the divalent linking group has —S—, —S(=O)$_2$—, —O—, —C(=O)—, or a group formed by a combination of two or more of these groups, instead of a methylene group comprised in the aliphatic hydrocarbon group, and
$L^2$ represents a divalent linking group formed by combination of an aliphatic hydrocarbon group and an aromatic hydrocarbon group, the divalent linking group has —S—, —S(=O)$_2$—, —O—, —C(=O)—, or a group formed by a combination of two or more of these groups, instead of a methylene group comprised in the aliphatic hydrocarbon group.

18. The cleaning liquid according to claim 1, further comprising an amino alcohol, wherein a content of the amino alcohol is 0.008% to 0.04% by mass with respect to a total mass of the cleaning liquid.

19. The cleaning liquid according to claim 1, further comprising an amino alcohol,
wherein a content of the amino alcohol is 10% to 70% by mass with respect to a total solid content of the cleaning liquid.

20. The cleaning liquid according to claim 1, wherein the cleaning liquid has a pH of 8.0 to 11.5 at 25° C.

* * * * *